(12) United States Patent
Ooishi

(10) Patent No.: US 6,829,173 B2
(45) Date of Patent: Dec. 7, 2004

(54) SEMICONDUCTOR MEMORY DEVICE CAPABLE OF ACCURATELY WRITING DATA

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 71 days.

(21) Appl. No.: 10/305,000

(22) Filed: Nov. 27, 2002

(65) Prior Publication Data
US 2003/0218910 A1 Nov. 27, 2003

(30) Foreign Application Priority Data
May 23, 2002 (JP) ........................................ 2002-149575

(51) Int. Cl.[7] .............................. G11C 16/04; G11C 7/00
(52) U.S. Cl. ............................... 365/185.28; 365/189.01
(58) Field of Search ........................ 365/185.2, 189.01, 365/189.09, 185.28, 189.04

(56) References Cited

U.S. PATENT DOCUMENTS 5,734,612 A * 3/1998 Yoshikawa ............. 365/185.13
5,886,927 A * 3/1999 Takeuchi ............... 365/185.22
6,011,725 A    1/2000 Eitan

FOREIGN PATENT DOCUMENTS

JP    P2001-110918 A    4/2001

* cited by examiner

Primary Examiner—Thong Q. Le
(74) Attorney, Agent, or Firm—McDermott Will & Emery LLP

(57) ABSTRACT

In storing multiple data into a storage area of a first nonvolatile memory cell and into a storage area of a second nonvolatile memory cell in a memory cell array, a first control circuit turns on a switch circuit to supply a predetermined write potential to a bit line, and a second control circuit turns on two switch circuits to supply a source potential to each of two bit lines according to the combination of multiple data to be stored in each memory cell.

5 Claims, 19 Drawing Sheets

SEMICONDUCTOR MEMORY DEVICE CAPABLE OF ACCURATELY WRITING DATA

BACKGROUND OF THE INVENTION

1. Field of the Invention

The present invention relates to semiconductor memory devices. In particular, the present invention relates to a semiconductor memory device including a plurality of memory cells each having two storage areas.

2. Description of the Background Art

NROM (Nitride Read-Only Memory) is now attracting attention as one of flash EEPROMs (Electrically Erasable Programmable Read-Only Memories) that are nonvolatile semiconductor memory devices. The NROM is disclosed in U.S. Pat. No. 6,011,725.

FIG. 22 is a circuit diagram showing a configuration of a memory cell array of a conventional semiconductor memory device.

Referring to FIG. 22, the memory cell array includes a plurality of nonvolatile memory cells MCs, a plurality of bit lines BLs and a plurality of word lines WLs.

Word lines WLs are arranged in respective rows and bit lines BLs are arranged in respective columns.

Nonvolatile memory cells MCs are arranged correspondingly to the crossings of word lines WLs and bit lines BLs. Nonvolatile memory cells MCs arranged in the same row are connected in series, having respective gates connected to the same word line WL. Bit lines BLs are each placed to pass the point where two nonvolatile memory cells MCs adjacent to each other are connected.

Nonvolatile memory cells MCs each have two storage areas L1 and L2.

FIG. 23 shows a cross section of one of the nonvolatile memory cells shown in FIG. 22.

Referring to FIG. 23, the nonvolatile memory cell includes a semiconductor substrate 1, two diffusion bit lines (hereinafter referred to as diffusion layers) 7A and 7B, oxide films 8 and 10, a nitride film 9, and a control gate 21.

Two diffusion layers 7A and 7B are formed with a predetermined distance therebetween on the main surface of semiconductor substrate 1. Oxide film 8 is formed on semiconductor substrate 1 and between the two diffusion layers. Nitride film 9 is formed on oxide film 8, oxide film 10 is formed on nitride film 9, and control gate 21 is formed on oxide film 10.

The nonvolatile memory cell can accumulate electrons in each of storage areas L1 and L2 in nitride film 9. In other words, the NROM allows electrons to be accumulated in two physically different places within one cell to store 2-bit data per cell.

The electrons accumulated in storage areas L1 and L2 in nitride film 9 cannot move freely in nitride film 9 and thus stay in storage areas L1 and L2, since nitride film 9 is an insulating film.

The semiconductor memory device as discussed above is easy to manufacture and the manufacturing cost is low. The memory cell array having the nonvolatile memory cell as shown in FIG. 23 includes the diffusion bit lines and word lines orthogonal to each other as shown in FIG. 22. Here, as memory cells adjacent to each other share the same diffusion bit line, the area of the memory cell array is reduced relative to that of conventional flash EEPROMs.

Description is now given below of data writing/reading operations into/from each of the storage areas L1 and L2 of the nonvolatile memory cell MC.

FIGS. 24–27 illustrate writing/reading operations of data for the two storage areas in the nonvolatile memory cell MC.

Referring to FIG. 24, nonvolatile memory cell MC has its gate connected to word line WL, and the memory cell MC is connected to bit lines BL0 and BL1. Nonvolatile memory cell MC has its sides corresponding respectively to bit lines BL0 and BL1, and storage area L1 is placed on the side corresponding to bit line BL0 as shown in FIGS. 24 and 25 while storage area L2 is placed on the side corresponding to bit line BL1 as shown in FIGS. 26 and 27.

A writing operation for storage area L1 is described first. Referring to FIG. 24, data is written into storage area L1 by maintaining the potential on bit line BL0 at a write potential VCCW and maintaining the potential on bit line BL1 at a ground potential GND to cause a write current Ifw to flow from bit line BL0 to bit line BL1 through nonvolatile memory cell MC. Data is thus written into storage area L1.

Next, a reading operation for storage area L1 is described. Referring to FIG. 25, data in storage area L1 is read by maintaining the potential on bit line BL0 at ground potential GND and maintaining the potential on bit line BL1 at a read potential VCCR to cause a read current Ifr to flow from bit line BL1 to bit line BL0. The data is accordingly read from storage area L1.

It is seen from the above that, in storage area L1, the direction in which the current flows in the writing operation is opposite to that of the current flowing in the reading operation.

A writing operation for storage area L2 is now described. Referring to FIG. 26, data is written into storage area L2 by maintaining the potential on bit line BL0 at ground potential GND and maintaining the potential on bit line BL1 at write potential VCCW to cause a write current Irw to flow from bit line BL1 to bit line BL0. Then, data is written into storage area L2.

A reading operation for storage area L2 is described below. Referring to FIG. 27, data is read from storage area L2 by maintaining the potential on bit line BL0 at read potential VCCR and maintaining the potential on bit line BL1 at ground potential GND to cause a read current Irr to flow from bit line BL0 to bit line BL1. Then, data is read from storage area L2.

It is also seen from the above that, in storage area L2, the direction in which the current flows in the writing operation is opposite to that of the current flowing in the reading operation. Moreover, respective writing currents in writing data into storage areas L1 and L2 flow in opposite directions respectively. Similarly, respective reading currents in reading data from storage areas L1 and L2 flow in opposite directions respectively.

It is accordingly essential to control the potential on each bit line BL for the writing operation of the NROM.

FIG. 28 illustrates a writing operation for nonvolatile memory cells arranged in the memory cell array as shown in FIG. 22.

Referring to FIG. 28, an operation of writing data of an H (logical high) level into storage area L1 of a nonvolatile memory cell MC1 shown in FIG. 28 is described below.

A word line WL1 is selected, and the potential on bit line BL1 is maintained at write potential VCCW while the potential on bit line BL2 is maintained at ground potential GND. At this time, in nonvolatile memory cell MC1, write current Ifw flows from the node connected to bit line BL1 to the node connected to bit line BL2. Data is accordingly written into storage area L1. Here, in a nonvolatile memory cell MC0 adjacent to nonvolatile memory cell MC1, an unwanted current I1 flows if the potential on bit line BL0 is lower than the potential on bit line BL1. The unwanted current I1 impedes power savings and, in addition, the unwanted current I1 could cause any malfunction of the memory cell array. Control is thus important of the potential on each bit line BL for the writing operation of the NROM.

Moreover, conventional semiconductor memory devices such as the NROM for example can write only one bit at a time into a memory cell, which means that there is a problem of a low throughput.

SUMMARY OF THE INVENTION

One object of the present invention is to provide a semiconductor memory device capable of writing data without malfunction. Another object of the present invention is to provide a semiconductor memory device with an improved throughput.

According to one aspect of the present invention, a semiconductor memory device includes a plurality of word lines arranged in the direction of rows, a plurality of bit lines arranged in the direction of columns, a plurality of memory cells, and a write circuit. The memory cells are arranged in the row direction and in the column direction and each have at least one storage area for storing data therein. The write circuit writes multiple data into the memory cells. The memory cells arranged in the row direction are connected in series and have respective gates connected to a word line placed in the row direction. The bit lines are connected correspondingly to the memory cells. The memory cells each store multiple data of at least three bits according to the amount of charge held in the storage area. The write circuit includes a bit line selection circuit and a potential supply circuit. The bit line selection circuit selects a plurality of bit lines connected to memory cells to be written. The potential supply circuit supplies a plurality of predetermined potentials according to a combination of the multiple data to the selected bit lines. Here, the selected bit lines include a bit line connected to the drain of the memory cells to be written and a bit line connected to the source of the memory cells to be written. The potential supply circuit supplies a predetermined first potential to the bit line connected to the drain and supplies a second potential determined according to the combination of the multiple data to the bit line connected to the source.

The semiconductor memory device of the present invention thus supplies the potential according to the combination of multiple write data, to the source of the memory cell to be written. As data of at least three bits can be written into one memory cell, the throughput is improved. Further, as the bit line selection circuit selects a plurality of bit lines and the potential supply circuit supplies different potentials respectively to the bit lines, a predetermined potential can be applied to any bit line connected to a memory cell into which data is to be written. Moreover, bit lines connected to memory cells other than the memory cell to be written enter the floating state. Accordingly, it is possible to prevent current from flowing out into the memory cells not to be written.

According to another aspect of the present invention, a semiconductor memory device includes a semiconductor substrate having a main surface, a memory cell array including a plurality of memory cells, and a write circuit applying a write potential to a selected one of the plurality of memory cells. The memory cells each include first and second conductive regions, a channel region, a first insulating film, a charge storage film, a second insulating film, and a conductive layer. The first and second conductive regions are formed on the main surface of the semiconductor substrate, the channel region is formed at the main surface of the semiconductor substrate and between the first conductive region and the second conductive region, channel hot electrons being generated in the channel region in a writing operation. The first insulating film is formed on the main surface of the semiconductor substrate and on the channel region, the charge storage film is formed on the first insulating film and having a plurality of storage areas, the second insulating film is formed on the charge storage film, and the conductive layer is formed on the second insulating film. The write circuit sets a potential difference between the first conductive region and the second conductive region of the memory cell at a potential difference determined according to a combination of multiple data written into the memory cell in writing operation.

The semiconductor memory device as discussed above is thus capable of writing multiple data according to the potential difference between the first and second conductive regions of the memory cell, which provides an improved throughput.

According to a further aspect of the present invention, a semiconductor memory device includes a semiconductor substrate of a first conductivity type having a main surface, a plurality of first conductive regions of a second conductivity type formed on the main surface of the semiconductor substrate at predetermined intervals therebetween, a plurality of second conductive regions of the first conductivity type formed on the main surface of the semiconductor substrate, the second conductive regions formed respectively in respective regions of the first conductive regions, and a plurality of memory cell arrays formed respectively in respective regions of the second conductive regions. The memory cell arrays each include a plurality of memory cells. The memory cells each include third and fourth conductive regions formed on the main surface of the semiconductor substrate, a channel region formed at the main surface of the semiconductor substrate and between the third conductive region and the fourth conductive region, channel hot electrons being generated in the channel region in a writing operation, a first insulating film formed on the main surface of the semiconductor substrate and on the channel region, a charge storage film formed on the first insulating film and having a plurality of storage areas, a second insulating film formed on the charge storage film, and a conductive layer formed on the second insulating film, A predetermined potential is supplied to the first conductive regions and the second conductive regions.

The semiconductor memory device is configured as discussed above to allow memory cell array blocks to be erased block by block. Accordingly, the potential of the semiconductor substrate can speedily be changed to reduce the erasure time.

Moreover, as there are a plurality of memory cell array blocks, the junction capacitance between the diffusion bit lines and the semiconductor substrate can be reduced relative to the conventional structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
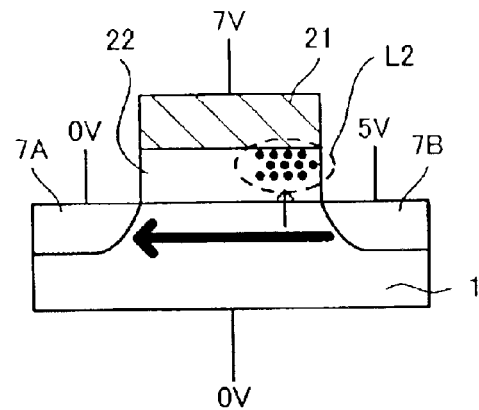
FIG. 1 illustrates a method of storing data by a semiconductor memory device according to one embodiment of the present invention.

Embodiments of the present invention are now described in detail in conjunction with the drawings. The same or corresponding components in the drawings are denoted by the same reference character and description thereof is not repeated here.

First Embodiment

Figure 2:
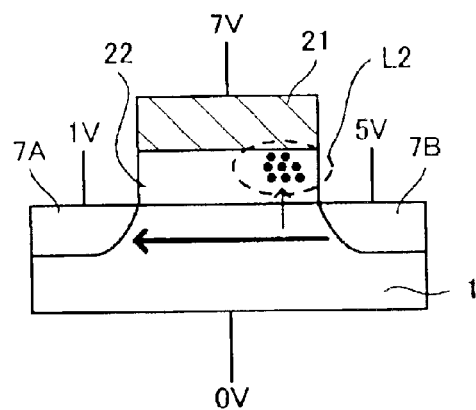
FIG. 2 illustrates another method of storing data by the semiconductor device of this embodiment.
Figure 3:
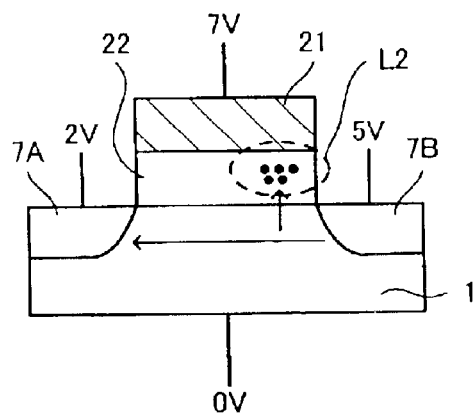
FIG. 3 illustrates still another method of storing data by the semiconductor memory device of this embodiment.

FIGS. 1–3 illustrate a method of storing data by a semiconductor memory device according to a first embodiment of the present invention.

Figure 23:
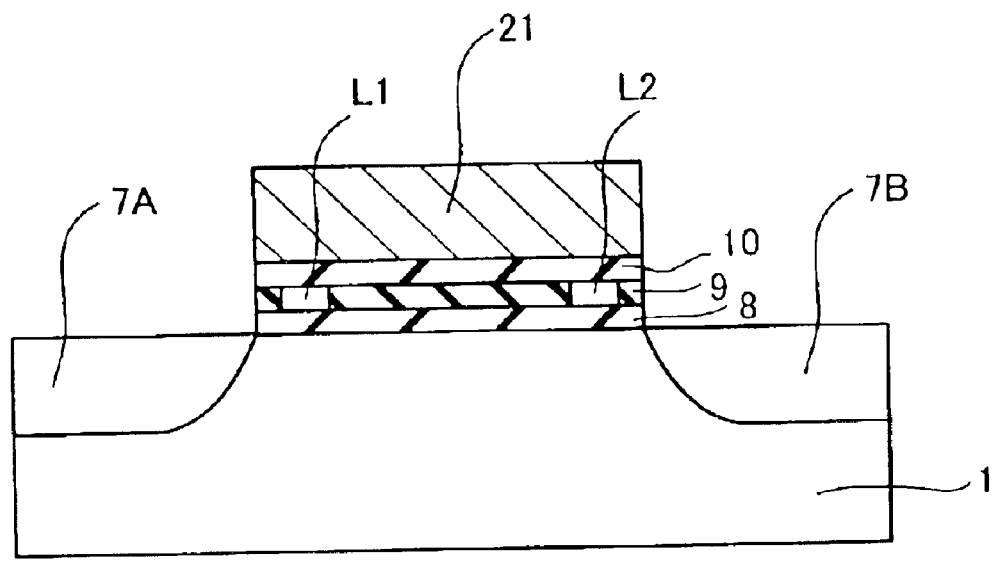
FIG. 23 shows a cross section of a nonvolatile memory cell as shown in FIG. 22.
Figure 24:
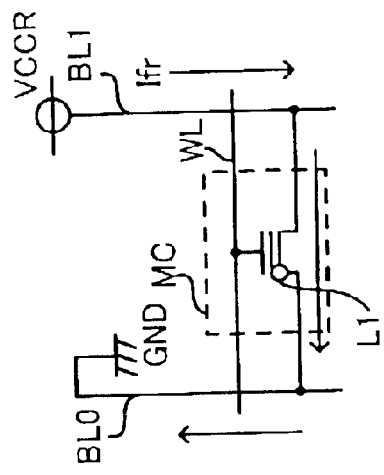
FIGS. 24 and 25 illustrate respective operations of writing data and reading data for a storage area L1 in a nonvolatile memory cell.
Figure 25:
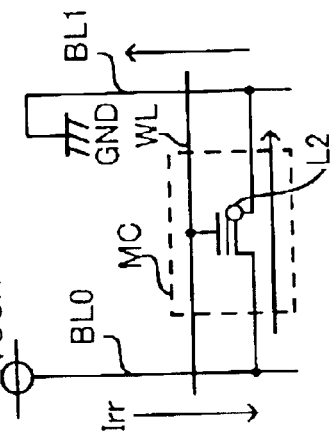
Figure 26:
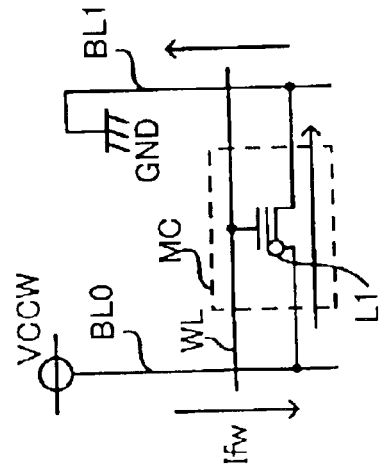
FIGS. 26 and 27 illustrate respective operations of writing data and reading data for a storage area L2 in the nonvolatile memory cell.
Figure 27:
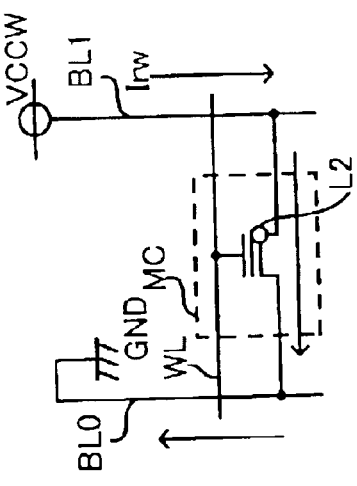
Figure 28:
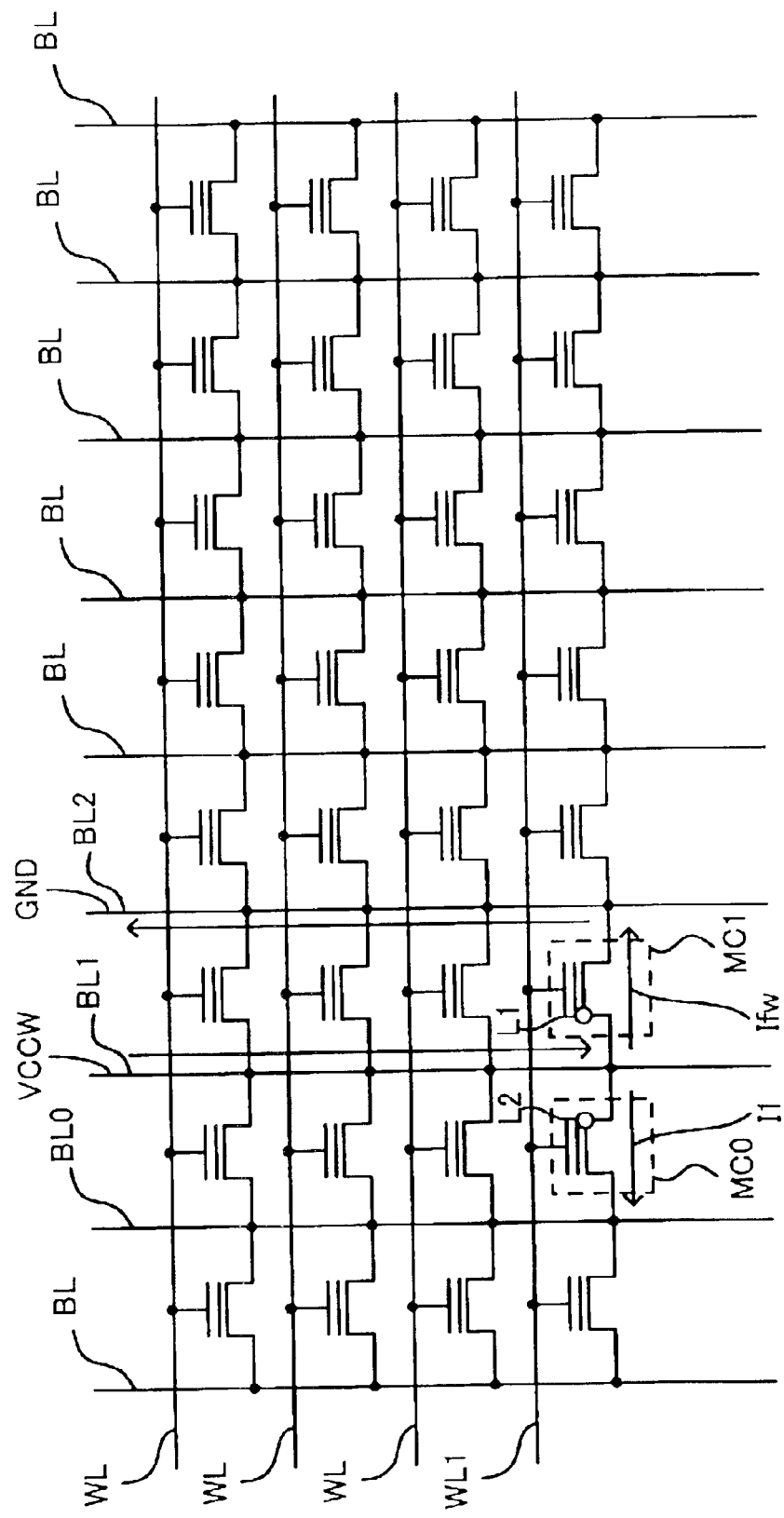
FIG. 28 illustrates a writing operation for nonvolatile memory cells arranged in the memory cell array as shown in FIG. 22.

A nonvolatile memory cell as shown in FIGS. 1–3 has the same cross sectional structure as that shown in FIG. 23. It is noted that the oxide film 8, nitride film 9 and oxide film 10 shown in FIG. 23 are collectively referred to as an ONO (Oxide-Nitride-Oxide) film 22 in FIGS. 1–3.

Data is written into a storage area L2 of the nonvolatile memory cell as described below.

Referring to FIG. 1, the nonvolatile memory cell has a control gate 21 applied with a voltage of 7 V, a diffusion layer 7B applied with a voltage of 5 V and a diffusion layer 7A applied with a voltage of 0 V. Diffusion layers 7B and 7A in FIGS. 1–3 are hereinafter referred to as drain and source respectively. Here, a voltage of 0 V is applied to a semiconductor substrate 1.

The direction of arrows shown in FIGS. 1–3 that extend from the drain toward the source indicates the direction of a current flow and the line width of the arrows indicates the magnitude of the current.

At this time, there are generated a first (vertical) electric field between semiconductor substrate 1 and control gate 21 and a second (lateral) electric field in the longitudinal direction of the channel extending from the source to the drain. The second electric field causes electrons to be drawn from the source into the channel and accelerated toward the drain. These electrons store energy in moving in the longitudinal direction of the channel. The electrons store the maximum energy when they reach the place near the drain. The electrons thus accelerated are called hot electrons. The hot electrons near the drain are injected into storage area L2 in ONO film 22.

The amount of the injected electrons thus depends on the drain-source voltage. More specifically, the amount of electrons that can be trapped is determined by the level of impurities corresponding to the energy derived from the drain-source voltage. Therefore, even if the time for writing is extended to exceed a certain time period, the amount of electrons trapped in the storage area increases only slightly to reach saturation.

Referring to FIG. 2, the voltage applied to the source is not 0 V as shown in FIG. 1 but 1 V. Respective voltages applied to control gate 21, semiconductor substrate 1 and the drain are the same as those shown in FIG. 1.

The drain-source voltage in the case shown in FIG. 2 is smaller than that shown in FIG. 1. In other words, the energy supplied to hot electrons is smaller than that as shown in FIG. 1. Consequently, the amount of electrons trapped in storage area L2 in FIG. 2 is smaller than that in FIG. 1.

Referring to FIG. 3, the voltage applied to the source is 2 V. Respective voltages applied to control gate 21, semiconductor substrate 1 and the drain are the same as those shown in FIGS. 1 and 2.

The drain-source voltage in FIG. 3 is thus further smaller than those in FIGS. 1 and 2 respectively. Accordingly, the amount of electrons trapped in storage area L2 in FIG. 3 is further smaller than those in FIGS. 1 and 2 respectively.

Regarding the writing operation as described above, the drain-source voltage applied to the nonvolatile memory cell can be controlled to adjust the amount of electrons trapped in the storage area. Then, four electron-trapped states, i.e., the electron-trapped states as shown in FIGS. 1–3 respectively and the non-written state, can be generated to allow the nonvolatile memory cell to have four threshold voltage levels. Then, 2-bit data can be stored in storage area L2. Moreover, for storage area L1, the drain-source voltage can be controlled as done for storage area L2 so as to store two-bit data in storage area L1. The drain-source voltage can thus be controlled to allow each nonvolatile memory cell to store 4-bit data.

Instead of adjusting the source voltage for decreasing the amount of trapped electrons as shown in FIGS. 1–3, the drain voltage may be decreased while the source voltage is fixed so as to decrease the amount electrons trapped in storage area L2. In addition, the voltage applied to control gate 21 may be lowered to decrease the amount of electrons trapped in storage area L2.

Although the area where electrons are trapped is in the ONO film in the description above, electrons may be trapped in any combination of insulating and trapping layers. Moreover, the region where electrons are trapped may be in a stack of insulating and trapping layers. In this case, electrons trapped in an upper-level trapping layer are less likely to pass through into a lower-level trapping layer.

Adjustment of the source voltage is described below according to this embodiment.

Figure 4:
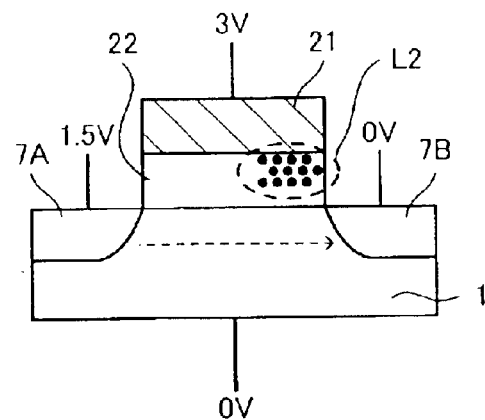
FIG. 4 illustrates a method of reading data trapped in a storage area in FIG. 1.
Figure 5:
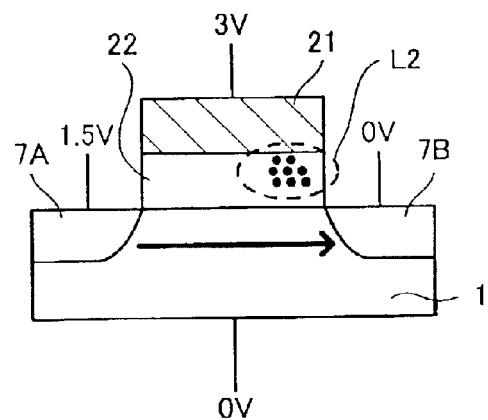
FIG. 5 illustrates a method of reading data trapped in a storage area in FIG. 2.
Figure 6:
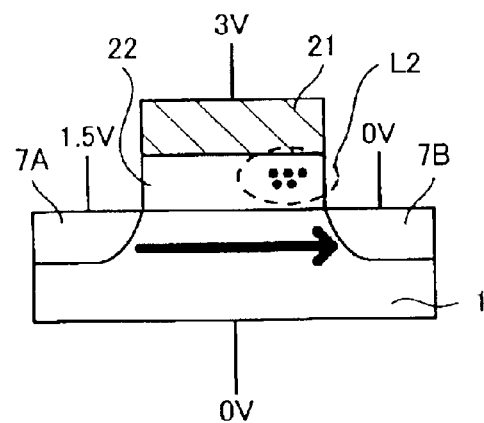
FIG. 6 illustrates a method of reading data trapped in a storage area in FIG. 3.

FIGS. 4–6 illustrate a method of reading data with electrons trapped in storage area L2 shown in FIGS. 1–3.

FIG. 4 illustrates a reading operation for the nonvolatile memory cell after the writing operation as shown in FIG. 1 is completed. Referring to FIG. 4, the nonvolatile memory cell has diffusion layer 7A applied with a voltage of 1.5 V, diffusion layer 7B applied with a voltage of 0 V, control gate 21 applied with a voltage of 3 V, and semiconductor substrate 1 applied with a voltage of 0 V. Then, the current flows from diffusion layer 7A to diffusion layer 7B for the reading operation while the current flows from diffusion layer 7B to diffusion layer 7A for the writing operation described above. In other words, for the writing and reading operations respectively, the current flows in respective directions opposite to each other. Through the above-described operation, the amount electrons stored in storage area L2 can be detected as the threshold value determined.

FIG. 5 illustrates a reading operation for the nonvolatile memory cell after the writing operation as shown in FIG. 2 is completed. As shown in FIG. 5, 1.5 V is applied to diffusion layer 7A, 0 V is applied to diffusion layer 7B, and 3 V is applied to control gate 21 as done for the operation as shown in FIG. 4. The data stored in storage area L2 is accordingly read.

FIG. 6 illustrates a reading operation for the nonvolatile memory cell after the writing operation as shown in FIG. 3 is completed. Respective voltages that are the same as those in FIG. 4 are applied to respective components to read data stored in storage area L2.

Through the reading operations as described above, it is possible to read the amount of electrons trapped at each of a plurality of levels detecting different amounts of electrons trapped in storage area L2 as threshold values respectively.

Figure 7:
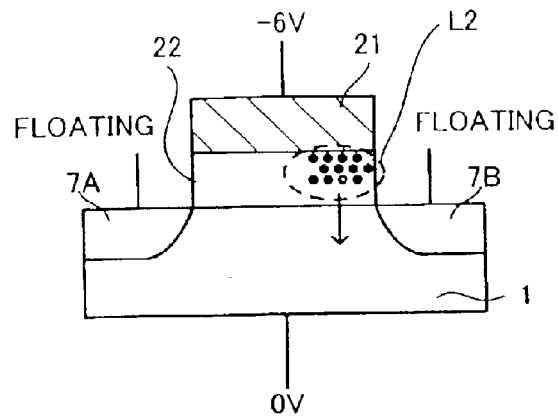
FIG. 7 illustrates a method of erasing a nonvolatile memory cell after the writing operation shown in FIG. 1.
Figure 8:
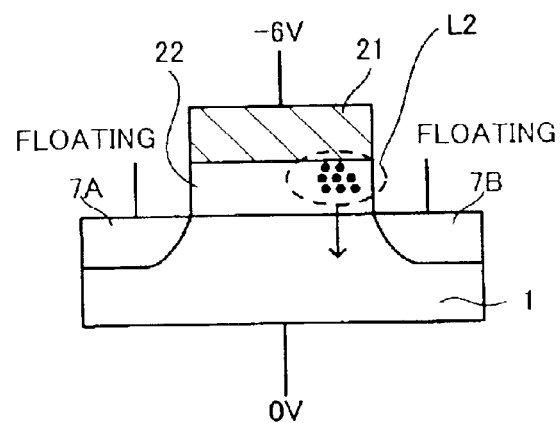
FIG. 8 illustrates a method of erasing a nonvolatile memory cell after the writing operation shown in FIG. 2.
Figure 9:
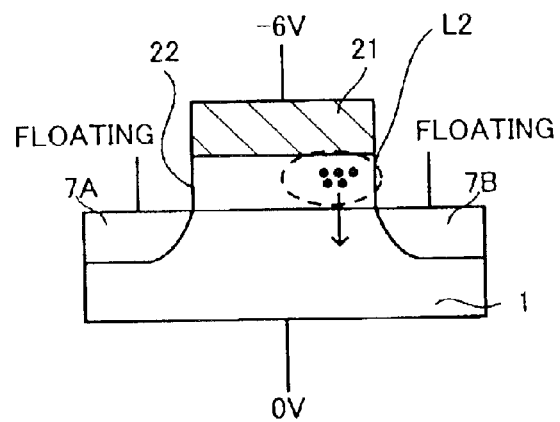
FIG. 9 illustrates a method of erasing a nonvolatile memory cell after the writing operation shown in FIG. 3.

FIGS. 7–9 illustrate a method of erasing data with electrons trapped in storage area L2 as shown in FIGS. 1–3.

FIG. 7 illustrates an erasing operation for the nonvolatile memory cell after the writing operation shown in FIG. 1 is completed, FIG. 8 illustrates an erasing operation for the nonvolatile memory cell after the writing operation shown in FIG. 2 is completed, and FIG. 9 illustrates an erasing operation for the nonvolatile memory cell after the writing operation shown in FIG. 3 is completed. Referring to FIGS. 7–9, in any of the erasing operations shown respectively in FIGS. 7–9, a negative voltage of −6 V for example is applied to control gate 21 and a positive voltage of 4 V for example is applied to semiconductor substrate 1. In addition, diffusion layers 7A and 7B are both in the floating state. Then, electrons trapped in storage area L2 are drawn into semiconductor substrate 1. In the semiconductor memory device of this embodiment, the erasing operation is accomplished by drawing out electrons trapped in the insulating (ONO) film of the nonvolatile memory cell. Therefore, no over-erase occurs.

As discussed above, electrons are drawn toward the substrate in the erasing operation, and the semiconductor memory device is thus configured to isolate respective semiconductor-substrate regions each corresponding to bit (s) erased at a time. More specifically, if a nonvolatile memory cell is formed on an N-type silicon, the N-type silicon is isolated from other regions by being surrounded by a P-type silicon. If the nonvolatile memory cell is formed on a P-type silicon, the P-type silicon is isolated from other regions by being surrounded by an N-type region.

Figure 10:
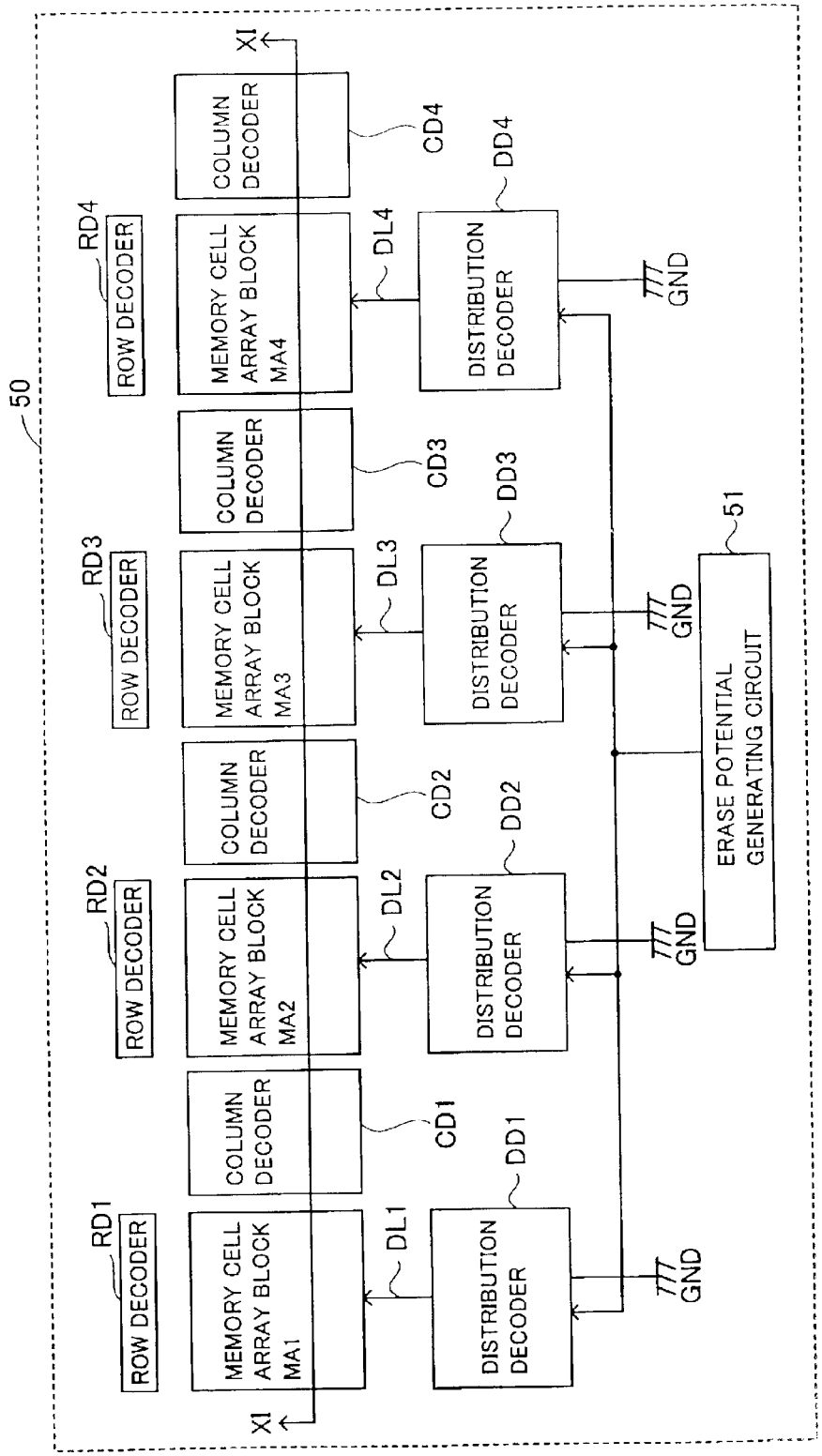
FIG. 10 is a circuit diagram showing the entire configuration of a semiconductor memory device having memory cell array blocks that can be erased independently of each other.

FIG. 10 is a circuit diagram showing the entire configuration of a semiconductor memory device having memory cell array blocks that can be erased independently of each other.

Referring to FIG. 10, semiconductor memory device 50 includes a plurality of memory cell array blocks MA1–MA4, a plurality of row decoders RD1–RD4, a plurality of column decoders CD1–CD4, a plurality of distribution decoders DD1–DD4, and an erase potential generating circuit 51.

Memory cell array blocks MA1–MA4 each include a plurality of word lines, a plurality of bit lines and a plurality of memory cells (not shown). Row decoder RD1 receives an address signal to designate a row address within memory cell array block MA1. Column decoder CD1 receives an address signal to designate a column address within memory cell array block MA1. Similarly, row decoder RD2 and column decoder CD2 respectively designate a row address and a column address within memory cell array block MA2, row decoder RD3 and column decoder CD3 respectively designate a row address and a column address within memory cell array block MA3, and row decoder RD4 and column decoder CD4 respectively designate a row address and a column address within memory cell array block MA4.

Erase potential generating circuit 51 supplies an erase potential VCCE to each of memory cell array blocks MA1–MA4 in an erasing operation. Distribution decoder DD1 receives erase potential VCCE and ground potential GND to supply ground potential GND to memory cell array block MA1 through a signal line DL1 in a writing operation. Further, distribution decoder DD1 supplies erase potential VCCE to memory cell array block MA1 through signal line DL1 in an erasing operation. Similarly to distribution decoder DD1, distribution decoders DD2–DD4 supply appropriate potentials through respective signal lines DL2–DL4 to respective memory cell array blocks MA2–MA4.

Figure 11:
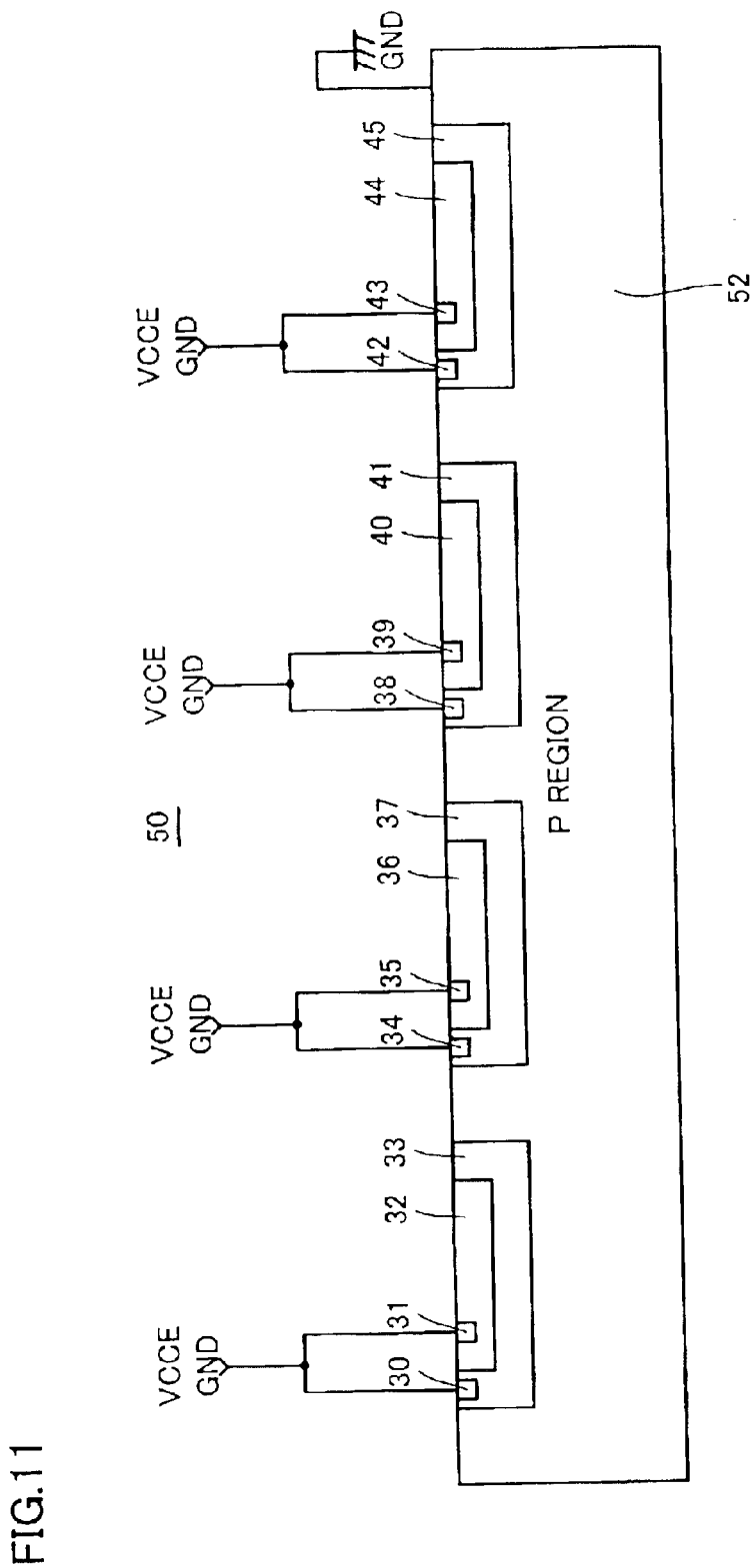
FIG. 11 shows a cross section along line XI—XI in FIG. 10.

FIG. 11 shows a cross section along line XI—XI in FIG. 10.

Referring to FIG. 11, a p-type semiconductor substrate 52 has its main surface where n wells 33, 37, 41 and 45 are formed at predetermined intervals therebetween. P well 32 is formed in the region of n well 33 on the main surface of semiconductor substrate 52. Similarly, p wells 36, 40 and 44 are formed respectively in respective regions of n wells 37, 41 and 45 on the main surface of semiconductor substrate 52.

P wells 32, 36, 40 and 44 correspond respectively to the regions of respective memory cell array blocks MA1, MA2, MA3 and MA4 in FIG. 10. Signal line DL1 is connected to a high-concentration region 31 in p well 32 and to a high concentration region 30 in n well 33. Signal line DL2 is connected to a high concentration region 35 in p well 36 and to a high concentration region 34 in n well 37. Signal line DL3 is connected to a high concentration region 39 in p well 40 and to a high concentration region 38 in n well 41. Signal line DL4 is connected to a high concentration region 42 in n well 45 and to a high concentration region 43 in p well 44. Ground potential GND is supplied to semiconductor substrate 52.

An erasing operation of the semiconductor memory device having, the above-described configuration is described now.

First of all, for writing/reading operations of semiconductor memory device 50, distribution decoders DD1–DD4 supply ground potential GND to respective memory cell array blocks MA1–MA4. Accordingly, no electron is drawn into semiconductor substrate 52 in each of memory cell array blocks MA1–MA4.

Then, in order to erase only the memory cell array block MA1, distribution decoder DD1 supplies erase potential VCCE from erase potential generating circuit 51 between p well 32 and n well 33, while other distribution decoders DD2–DD4 supply ground potential GND to respective memory cell array blocks MA2–MA4. The erase potential can thus be supplied between only the p well 32 and n well 33 that are regions corresponding to memory cell array block MA1. In this way, only the memory cells in memory cell array block MA1 can be erased.

Similarly, only the memory cells in a memory cell array block selected from memory cell array blocks MA2–MA4 can be erased.

The semiconductor memory device according to the present invention has memory cells each having a shorter distance between the gate and the semiconductor substrate relative to that of a nonvolatile memory cell having a floating gate. Therefore, the gate-semiconductor substrate voltage is large in erasure of the semiconductor memory device of the conventional structure, which means that a considerable time is taken for independently changing the potential, resulting in inefficiency.

For the semiconductor memory device configured according to the present invention, block-by-block erasure makes it possible to rapidly change the potential of the semiconductor substrate and thus shorten the erasure time.

Moreover, a plurality of memory cell array blocks are formed so that the junction capacitance between the diffusion bit line and the semiconductor substrate can be reduced relative to that of the conventional structure.

Circuitry for trapping electrons of multiple levels (different amounts of electrons, different threshold values) as described above is described now.

Figure 12:
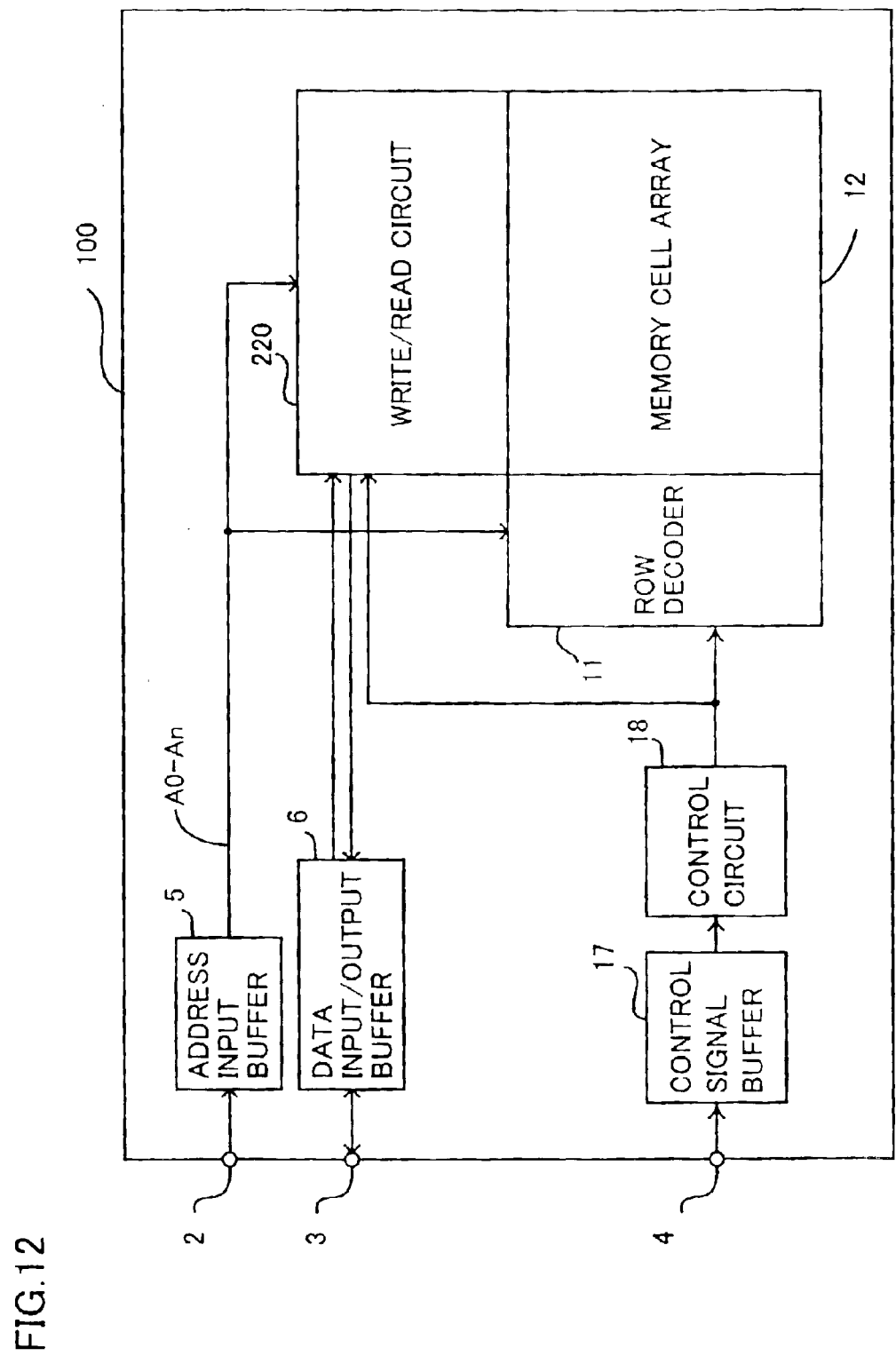
FIG. 12 is a block diagram schematically showing a configuration of a semiconductor memory device according to the embodiment of the present invention.

FIG. 12 is a block diagram schematically showing a configuration of a semiconductor memory device according to this embodiment of the present invention.

Referring to FIG. 12, semiconductor memory device 100 includes an address signal input terminal 2, a data signal terminal 3, a control signal input terminal 4, an address input buffer 5, a data input/output buffer 6, a control signal buffer 17, a control circuit 18, a write/read circuit 220, a row decoder 11 and a memory cell array 12.

Address input buffer 5 receives an external address signal supplied from address signal input terminal 2 to output internal address signals A0–An.

Data input/output buffer 6 supplies/receives data via data signal terminal 3 to/from any external component.

Control signal buffer 17 receives an external control signal via control signal input terminal 4 to output an internal control signal. Control circuit 18 receives the internal control signal to output various signals for controlling the whole of memory cell array 12.

Memory cell array 12 includes a plurality of word lines arranged in rows, a plurality of bit lines arranged in columns and a plurality of nonvolatile memory cells arranged in rows and columns. A row decoder 11 is placed in memory cell array 12.

Row decoder 11 receives internal address signals A0–An from address input buffer 5 to select a word line.

Write/read circuit 220 receives internal address signals A0–An from address input buffer 5, a data signal DQ from data input/output buffer 6, and the control signals from control circuit 18 to perform writing operations for a plurality of the nonvolatile memory cells within memory cell array 12. Further, write/read circuit 220 receives internal address signals A0–An and control signals to perform reading operations for the nonvolatile memory cells within memory cell array 12. Data read therefrom is output via data input/output buffer 6 and data signal terminal 3.

Figure 13:
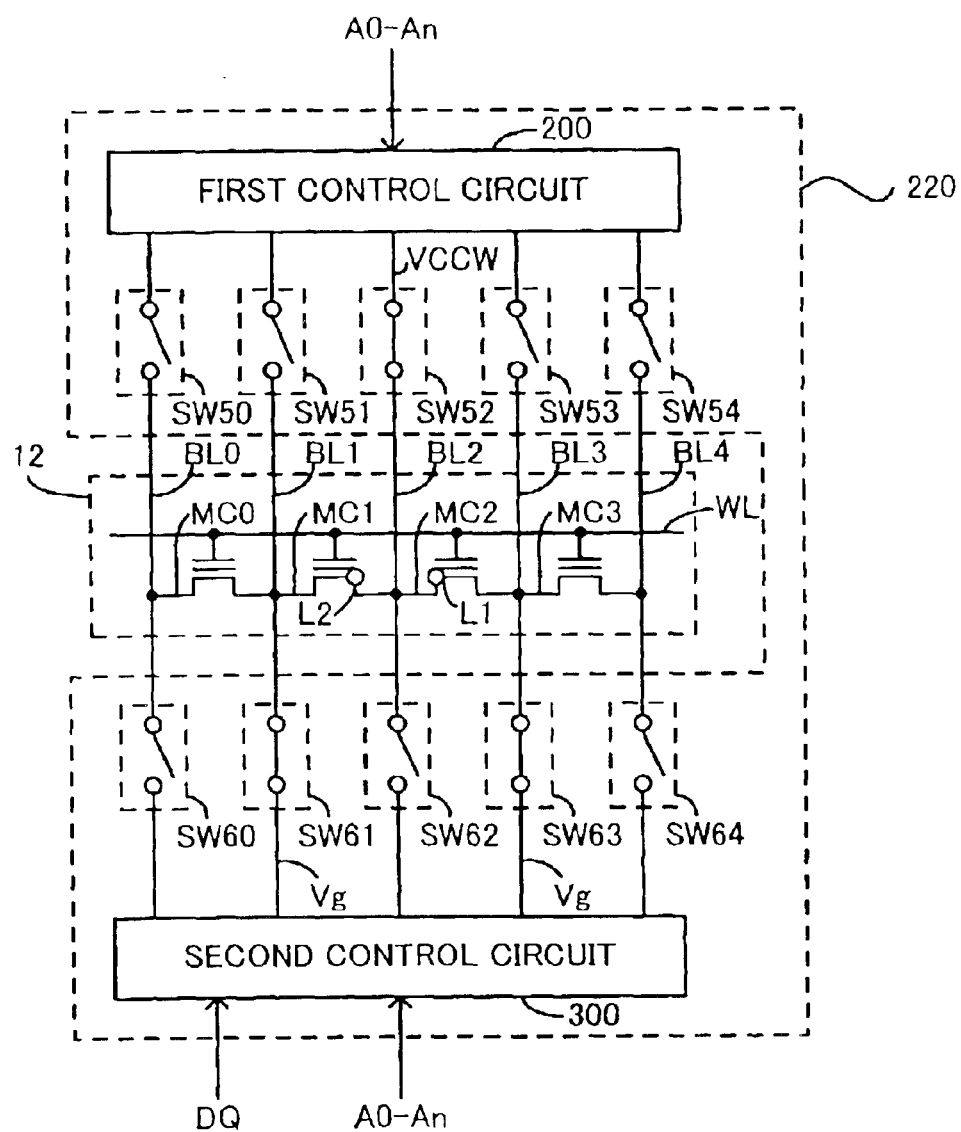
FIG. 13 is a block diagram illustrating an exemplary writing operation by a write/read circuit in FIG. 12.

FIG. 13 is a block diagram illustrating an exemplary writing operation by the write/read circuit shown in FIG. 12.

Referring to FIG. 13, write/read circuit 220 includes a first control circuit 200, a second control circuit 300, a plurality of first switch circuits SW50–SW54, and a plurality of second switch circuits SW60–SW64.

The first switch circuits SW50–SW54 are connected to the first control circuit 200 while the second switch circuits SW60–SW64 are connected to the second control circuit 300.

Figure 22:
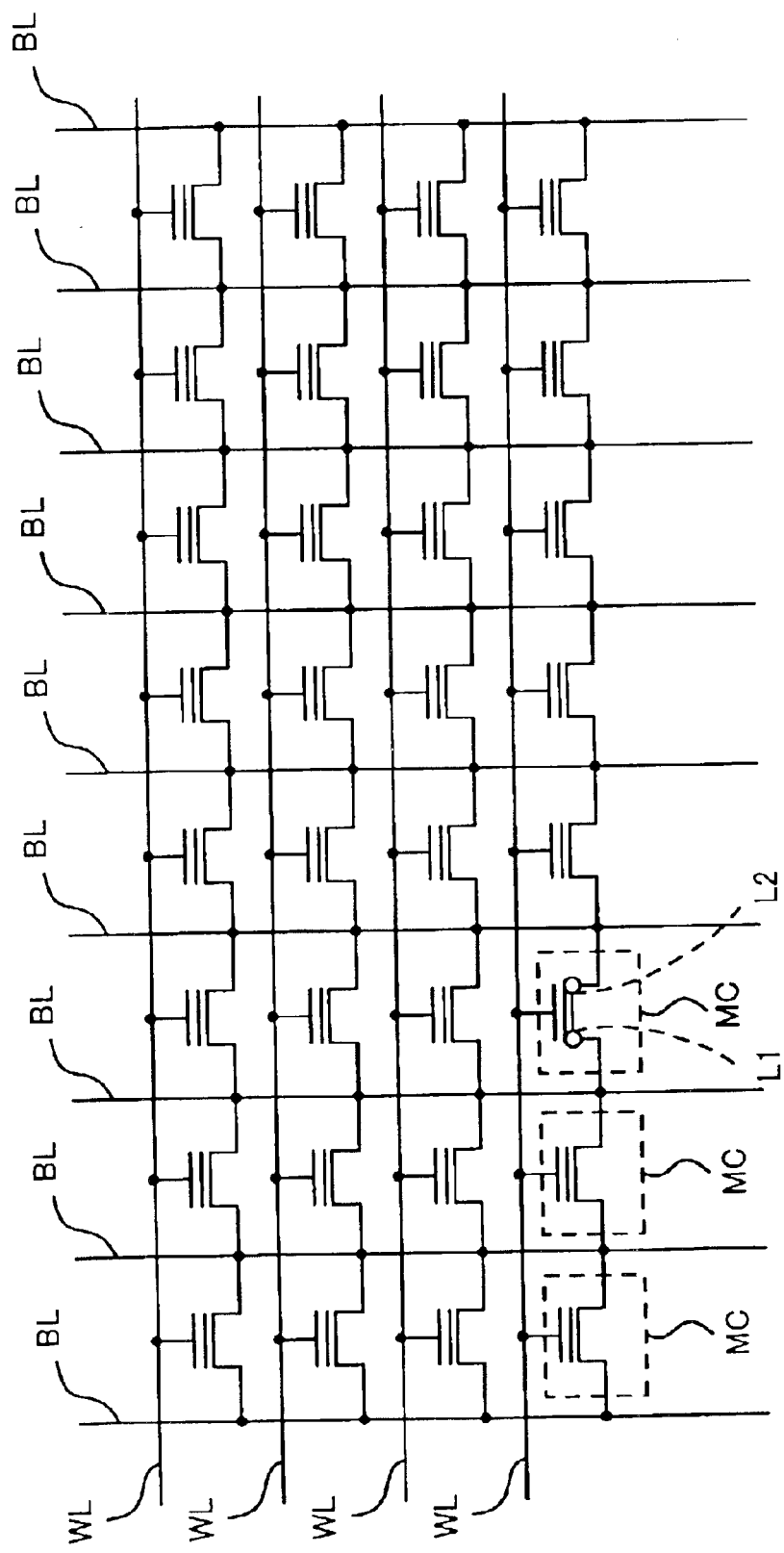
FIG. 22 is a circuit diagram showing a configuration of a memory cell array of a conventional nonvolatile semiconductor memory device.

Memory cell array 12 includes a plurality of bit lines BL0–BL4, a plurality of nonvolatile memory cells MC0–MC3 and a word line WL. It is noted here that the simplified circuit configuration of the memory cell array is shown in FIG. 13 for ease of the description. In actual, the memory cell array includes a plurality of word lines, a plurality of bit lines and a plurality of nonvolatile memory cells as shown in FIG. 22.

Bit line BL0 is connected to the first switch circuit SW50 and the second switch circuit SW60. Similarly, bit line BL1 is connected to the first switch circuit SW51 and the second switch circuit SW61, bit line BL2 is connected to the first switch circuit SW52 and the second switch circuit SW62, bit line BL3 is connected to the first switch circuit SW53 and the second switch circuit SW63, and bit line BL4 is connected to the first switch circuit SW54 and the second switch circuit SW64.

Here, H level data is to be written into storage area L2 of nonvolatile memory cell MC1 while H level data is to be written into storage area L1 of nonvolatile memory cell MC2. Then, the first control circuit 200 in write/read circuit 220 receives address signals A0–An to turn on the first switch circuit SW52 and supply write potential VCCW to bit line BL2. The second control circuit 300 receives address signal A0–An and data signal DQ to turn on the second switch circuits SW61 and SW63 and supply source potential Vg to bit lines BL1 and BL3. Then, data corresponding to the potential difference between write potential VCCW and source potential Vg is written into memory cells MC1 and MC2. The remaining bit lines BL0 and BL4 are not connected to the first control circuit 200 and the second control circuit 300 to provide a floating state and then no write current flows.

Figure 14:
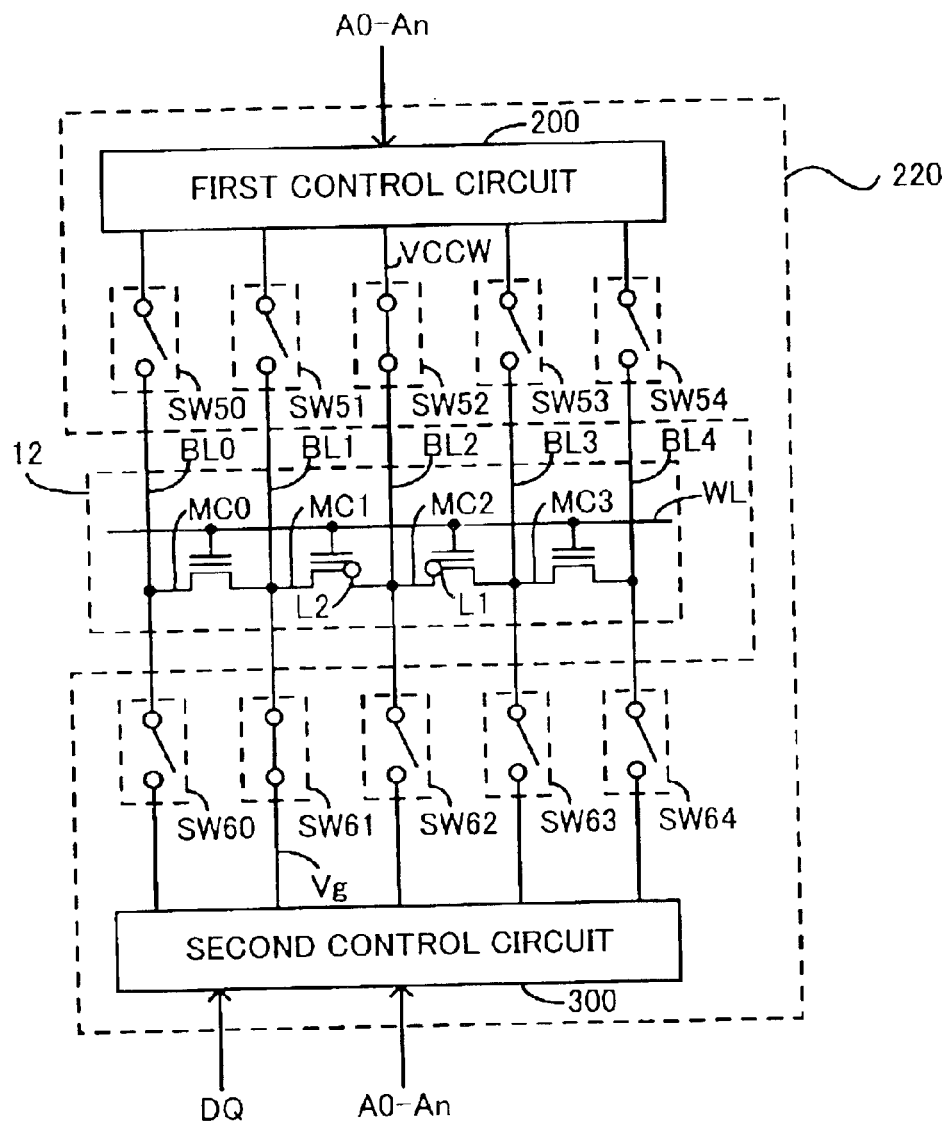
FIG. 14 is a block diagram illustrating another exemplary writing operation by the write/read circuit in FIG. 12.

FIG. 14 is a block diagram illustrating another exemplary writing operation by the write/read circuit shown in FIG. 12.

Referring to FIG. 14, H level data is written into storage area L2 of nonvolatile memory cell MC1 and L level data is written into storage area L1 of memory cell MC2 as described below. The first control circuit 200 in write/read circuit 220 receives address signals A0–An to turn on the first switch circuit SW52. The first control circuit 200 supplies write potential VCCW to bit line BL2. The second control circuit 300 receives address signals A0–An and data signal DQ to turn on the second switch circuit SW61 only and supplies source potential Vg to bit line BL1. Accordingly, the H level data is written into memory cell MC1 while no write current flows through MC2.

Similarly, L level data is written into storage area L2 of nonvolatile memory cell MC1 and L level data is written into storage area L1 of memory cell MC2 as described below. In this case, the operation of the first control circuit 200 is the same as those as illustrated in FIGS. 13 and 14 while the second control circuit 300 turns off all of the second switch circuits SW60–SW64. Then, no write current flows through memory cells MC1 and MC2.

Although two switch circuits are provided per bit line in FIG. 14, one switch circuit may be provided per bit line. In such a case, the control circuit includes decoders for supplying write potential VCCW and source potential Vg.

Figure 15:
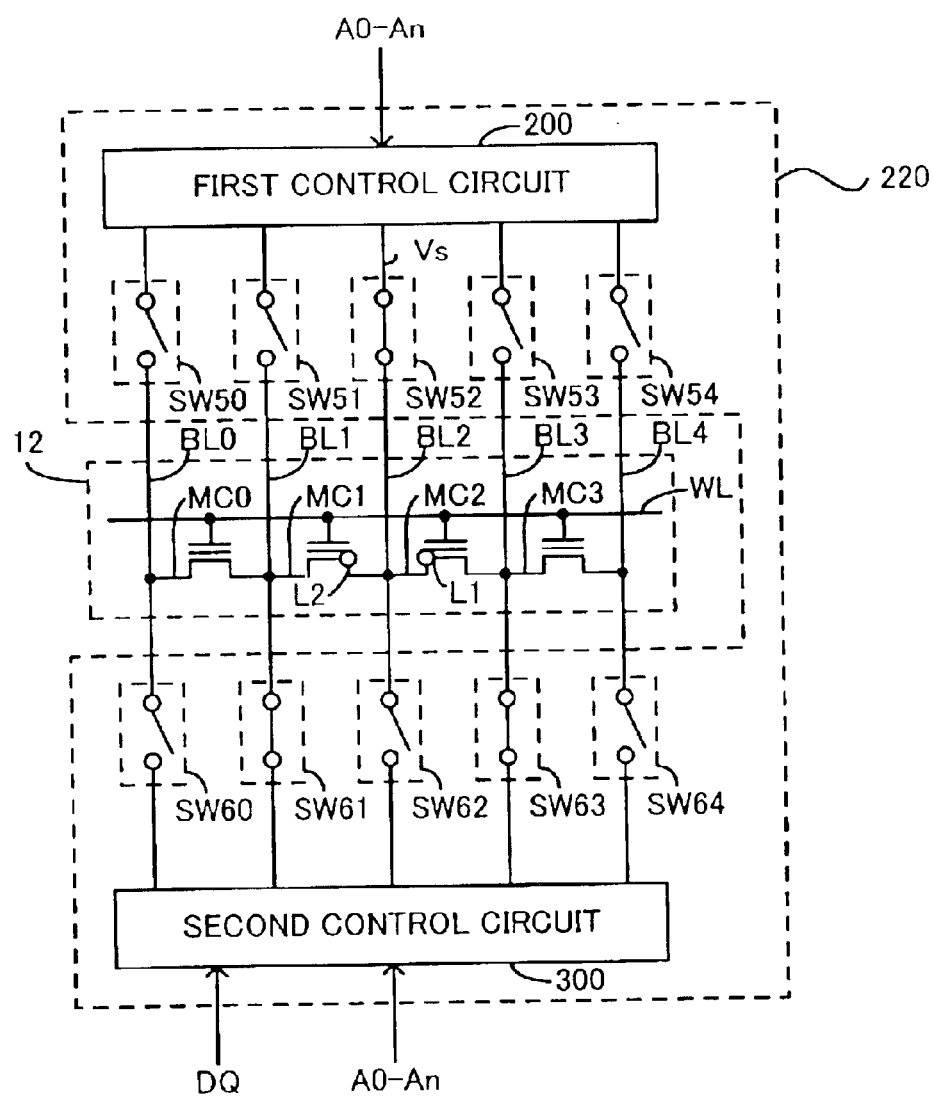
FIG. 15 is a block diagram illustrating an exemplary reading operation by the write/read circuit in FIG. 12.

FIG. 15 is a block diagram illustrating an exemplary reading operation by the write/read circuit 220 shown in FIG. 12.

Referring to FIG. 15, data in storage area L2 of nonvolatile memory cell MC1 and data in storage area L1 of memory cell MC2 are read as described below.

In this case, the first control circuit 200 in write/read circuit 220 receives address signals A0–An to turn on the first switch circuit SW52. At this time, the first control circuit 200 supplies ground potential Vs to bit line BL2. The second control circuit 300 receives address signals A0–An to turn on the second switch circuits SW61 and SW63 to connect bit lines BL1 and BL3 to respective sense amplifiers (not shown). Accordingly, the data in memory cells MC1 and MC2 are read.

Figure 16:
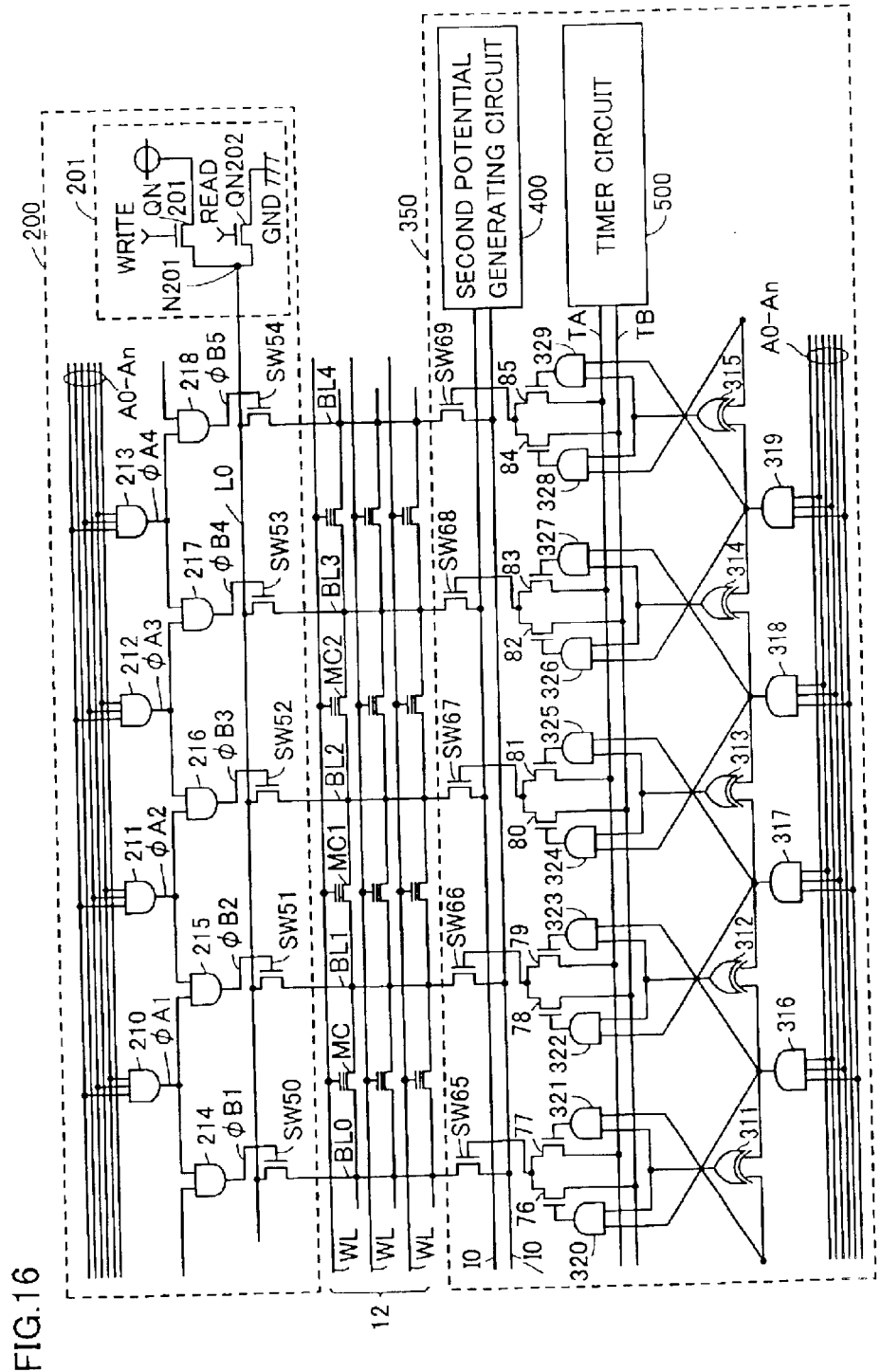
FIG. 16 is a circuit diagram showing a detailed configuration of the write/read circuit and a memory cell array in FIG. 12.

FIG. 16 is a circuit diagram showing in detail the write/read circuit and memory cell array shown in FIG. 12.

Referring to FIG. 16, the first control circuit 200 includes a plurality of logic gates 210–218 and a first potential generating circuit 201.

Logic gates 210–213 each receive address signals A0–An from three input terminals to output the result of the AND operation. Logic gate 214 receives the output signal from logic gate 210 and an output signal from a logic gate (not shown) adjacent to logic gate 210 to output the result of the AND operation. Similarly, logic gate 215 receives respective output signals from logic gate 210 and logic gate 211 to output the result of the AND operation. Logic gate 216 receives respective output signals from logic gate 211 and logic gate 212 to output the result of the AND operation. Logic gate 217 receives respective output signals from logic gates 212 and 213 to output the result of the AND operation. Logic gate 218 receives the output signal from logic gate 213 and an output signal from a logic gate (not shown) adjacent to logic gate 213 to output the result of the AND operation.

The first potential generating circuit 201 includes N-channel MOS transistors QN201 and QN202. Transistor QN201 is connected between a predetermined write potential VCCW node and an output node N201 and has its gate supplied with a write signal WRITE. Transistor QN202 is connected between a ground node GND and output node N201 and has its gate supplied with a read signal READ.

The first switch circuits SW50–SW54 are each constituted of an N-channel MOS transistor. The first switch circuit SW50 is connected between bit line BL0 and output node N201 and has its gate supplied with the output signal from logic gate 214. The first switch circuit SW51 is connected between bit line BL1 and output node N201 and has its gate supplied with the output signal from logic gate 215. The first switch circuit SW52 is connected between bit line BL2 and output node N201 and has its gate supplied with the output signal from logic gate 216. The first switch circuit SW53 is connected between bit line BL3 and output node N201 and has its gate supplied with the output signal from logic gate 217. The first switch circuit SW54 is connected between bit line BL4 and output node N201 and has its gate supplied with the output signal from logic gate 218.

Memory cell array 12 includes a plurality of word lines WLs, a plurality of bit lines BL0–BL4 and a plurality of nonvolatile memory cells MCs.

The second switch circuits SW65–SW69 are each constituted of an N-channel MOS transistor. The second switch circuit SW65 is connected between bit line BL0 and a data input/output line/IO. The second switch circuit SW66 is connected between bit line BL1 and data input/output line/IO. The second switch circuit SW67 is connected between bit line BL2 and a data input/output line IO. The second switch circuit SW68 is connected between bit line BL3 and data input/output line IO. The second switch circuit SW69 is connected between bit line BL4 and data input/output line/IO.

A second control circuit 350 includes a second potential generating circuit 400, a timer circuit 500, N-channel MOS transistors 76–85, and logic gates 311–329.

Transistor QN76 is connected between the gate of the second switch circuit SW65 and a signal line TB. Transistor QN77 is connected between the gate of the second switch circuit SW65 and a signal line TA. Transistor QN78 is connected between the gate of the second switch circuit SW66 and signal line TB, and transistor QN79 is connected between the gate of the second switch circuit SW66 and signal line TA. Transistor QN80 is connected between the gate of switch circuit SW67 and signal line TB, and transistor QN81 is connected between the gate of the second switch circuit SW67 and signal line TA. Transistor QN82 is connected between the gate of the second switch circuit SW68 and signal line TB, and transistor QN83 is connected between the gate of the second switch circuit SW68 and signal line TA. Transistor QN84 is connected between the gate of the second switch circuit SW69 and signal line TB, and transistor QN85 is connected between the gate of the second switch circuit SW69 and signal line TA.

Logic gate 320 receives respective output signals from logic gates 316 and 311 to output the result of the AND operation to the gate of transistor QN76. Logic gate 321 receives respective output signals from a logic gate (not shown) adjacent to logic gate 316 and logic gate 311 to output the result of the AND operation to the gate of transistor QN77. Logic gate 322 receives respective output signals from logic gates 317 and 312 to output the result of the AND operation to the gate of transistor QN78. Logic gate 323 receives respective output signals from logic gates 316 and 312 to output the result of the AND operation to the gate of transistor QN79. Logic gate 324 receives respective output signals from logic gates 318 and 313 to output the result of the AND operation to the gate of transistor QN80. Logic gate 325 receives respective output signals from logic gates 317 and 313 to output the result of the AND operation to the gate of transistor QN81. Logic gate 326 receives respective output signals from logic gates 319 and 314 to output the result of the AND operation to the gate of transistor QN82. Logic gate 327 receives respective output signals from logic gates 318 and 314 to output the result of the AND operation to the gate of transistor QN83. Logic gate 328 receives respective output signals from a logic gate (not shown) adjacent to logic gate 319 and logic gate 315 to output the result of the AND operation to the gate of transistor QN84. Logic gate 329 receives respective output signals from logic gates 319 and 315 to output the result of the AND operation to the gate of transistor QN85.

Figure 17:
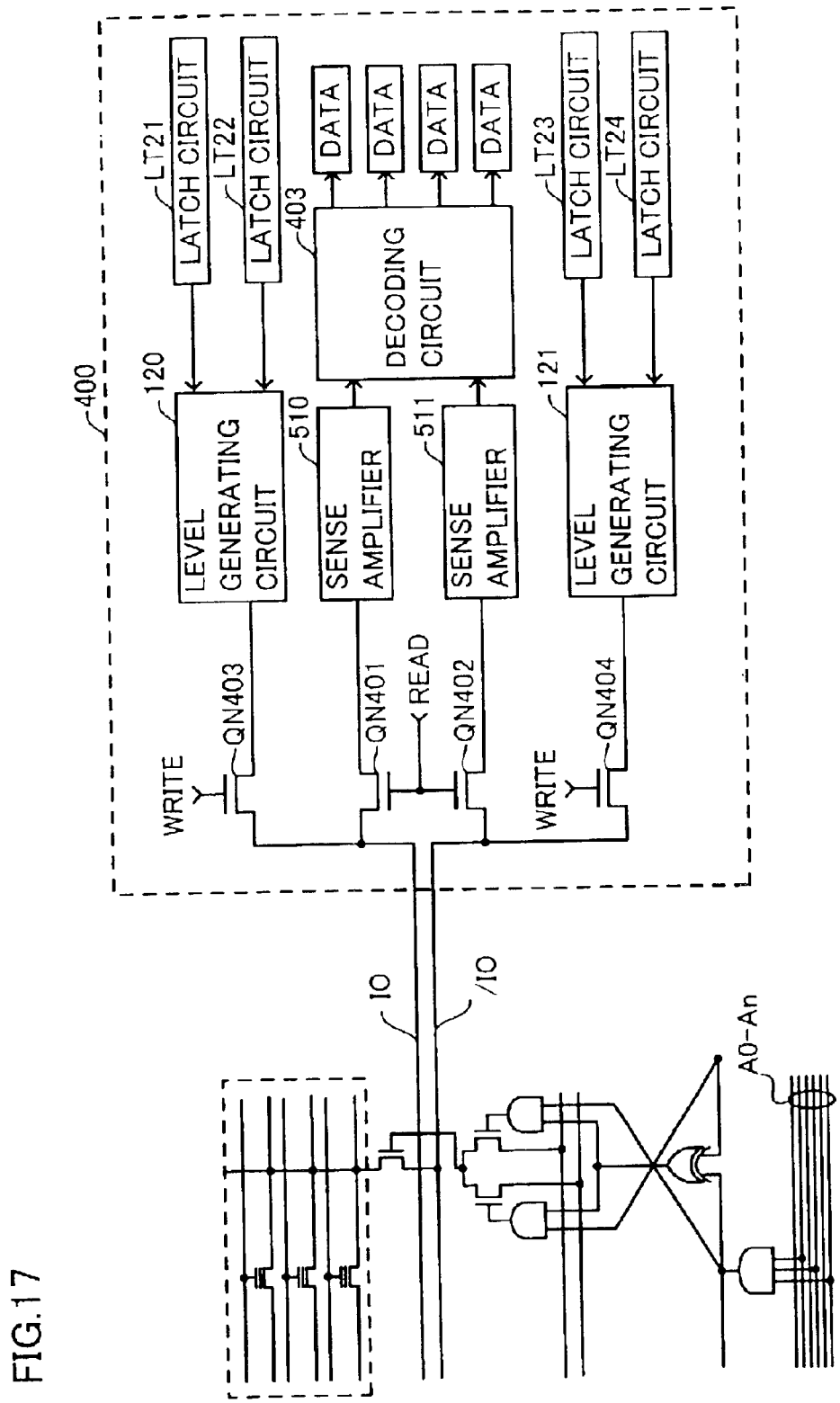
FIG. 17 is a circuit diagram showing a configuration of a second potential generating circuit in FIG. 16.

FIG. 17 is a circuit diagram showing a configuration of the second potential generating circuit 400 in FIG. 16.

Referring to FIG. 17, the second potential generating circuit 400 includes N-channel MOS transistors QN401–QN404, sense amplifiers 510 and 511, a decoding circuit 403, level generating circuits 120 and 121, and latch circuits LT21–LT24.

Transistor QN403 connected between data input/output line IO and level generating circuit 120 has its gate receiving write signal WRITE. Transistor QN401 connected between data input/output line IO and sense amplifier 510 has its gate receiving read signal READ. Transistor QN402 connected between data input/output line/IO and sense amplifier 511 has its gate receiving read signal READ. Transistor QN404 connected between data input/output line/IO and level generating circuit 121 has its gate receiving write signal WRITE.

Latch circuits LT21–LT24 latch respective data signals DQ1–DQ4 to be stored in storage area L1 or L2 of the nonvolatile memory cell in a writing operation. Specifically, latch circuit LT21 latches data signal DQ1, latch circuit LT22 latches data signal DQ2, latch circuit LT23 latches data signal DQ3, and latch circuit LT24 latches data signal DQ4. Level generating circuits 120 and 121 are capable of generating potentials of four levels, and one of the four potentials is floating potential. Level generating circuit 120 selects a potential according to the combination of data signals DQ 1 and DQ2 stored in latch circuits LT21 and LT22 and outputs the selected potential as a source voltage. Similarly, level generating circuit 121 selects a potential according to the combination of data signals DQ3 and DQ4 stored in latch circuits LT23 and LT24 and output the selected potential as a source voltage.

Decoding circuit 403 outputs 4-bit data based on the outcome of detection by sense amplifiers 510 and 511.

Figure 18:
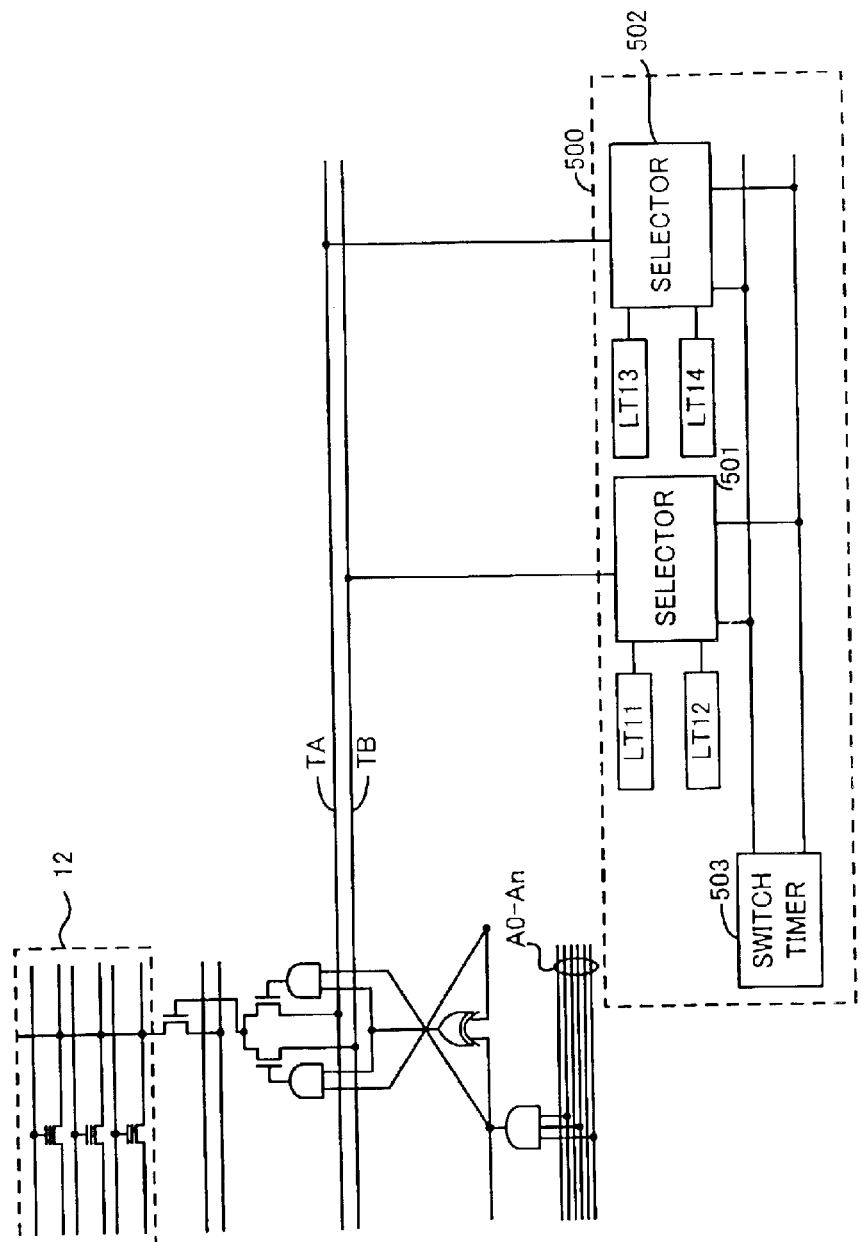
FIG. 18 is a circuit diagram showing a configuration of a timer circuit in FIG. 16.

FIG. 18 is a circuit diagram showing a configuration of timer circuit 500 in FIG. 16.

Referring to FIG. 18, timer circuit 500 includes a plurality of latch circuits LT11–LT14, selectors 501 and 502 and a switch timer 503.

Latch circuits LT11 and LT12 store respective data to be stored in storage area L2 of memory cell MC. Latch circuits LT13 and LT14 store respective data to be stored in storage area L1 of memory cell MC.

Switch timer 503 outputs a switch signal SS1 which is an H level pulse signal and a switch signal SS2 which is an L level signal. Selector 501 receives these two switch signals SS from switch timer 503 to output switch signal SS according to the combination of data latched by latch circuits LT11 and LT12, to signal line TB. Similarly, selector 502 receives two switch signals SS from switch timer 503 to output switch signal SS, to signal line TA, according to the combination of data latched by latch circuits LT13 and LT14.

The nonvolatile semiconductor memory device has the circuit configuration as discussed above. Write/read circuit 220 operates to write data into storage area L2 of memory cell MC1 and storage area L1 of memory cell MC2 shown in FIG. 16 as detailed below.

Write signal WRITE is driven to H level and accordingly address signals A0–An cause both of respective output signals from logic gates 211 and 212 to have H level. Then, the output signal from logic gate 216 has H level and the first switch circuit SW52 is turned on.

Further, address signals A0–An cause both of respective output signals from logic gates 317 and 318 to have H level. Both of respective output signals from logic gates 322 and 327 then have H level. Accordingly, both of transistors QN78 and QN83 are turned on.

Here, respective potentials on paired data signal lines IO and/IO are determined as follows.

Level generating circuit 120 in the second potential generating circuit 400 supplies the voltage which is selected according to the combination of data signals DQ1 and DQ2 latched respectively by latch circuits LT21 and LT22, to data signal line IO as the source voltage.

Similarly, level generating circuit 121 supplies the voltage which is selected according to the combination of data signals DQ3 and DQ4 latched respectively by latch circuits LT23 and LT24, to data signal line/IO as the source voltage.

In the period during which switch signal SS1 transmitted through signal line TB has H level, the second switch circuit SW66 is made on and thus the potential on bit line BL1 is kept at the source potential. Similarly, in the period during which switch signal SS1 transmitted through signal line TA has H level, the second switch circuit SW68 is made on and then the potential on bit line BL3 is kept at the source potential.

Other second switch circuits SW65, SW67 and SW69 are kept off. Accordingly, the potential on bit line BL2 is kept at write potential VCCW.

For nonvolatile memory cell MC1, one of bit lines BL1 and BL2 connected to nonvolatile memory cell MC1, i.e., bit line BL2, is kept at write voltage (drain voltage) VCCW while the other bit line, i.e., bit line BL1, is maintained at the source voltage supplied from level generating circuit 120. Then, electrons of the amount determined according to the drain-source voltage between bit lines BL2 and BL1 are trapped in storage area L2 of nonvolatile memory cell MC1. For nonvolatile memory cell MC2, one of bit lines BL2 and BL3 connected to nonvolatile memory cell MC2, i.e., bit line BL2 is kept at the drain voltage as described above while the other bit line BL3 is kept at the source voltage supplied from level generating circuit 121. Then, electrons of the amount determined according to the drain-source voltage between bit lines BL2 and BL3 are trapped in storage area L1 of nonvolatile memory cell MC2.

Here, since memory cell MC1 is an N-channel MOS transistor, the threshold value is increased by trapping of electrons. If memory cell MC1 is a P-channel MOS transistor, the threshold value would be increased by trapping of holes.

Similarly, switch signal SS transmitted through signal line TA is determined by the combination of data latched by latch circuits LT13 and LT14.

Through the above-described operation, 2-bit data can be stored in each of storage area L2 of memory cell MC1 and storage area L1 of memory cell MC2.

Data in storage area L2 of memory cell MC1 and data in storage area L1 of memory cell MC2 are read as described below.

Read signal READ is activated to cause the first switch circuit SW52 to be turned on and other first switch circuits SW50, SW51, SW53 and SW54 to be turned off in the reading operation. Transistor QN202 in the first potential generating circuit 201 is turned on and the potential on output node N201 is kept at ground potential GND.

As in the writing operation, the second switch circuits SW66 and SW68 are turned on. At this time, read potential VCCR is supplied from the write potential VCCW node (not shown) and respective potentials on signal lines TA and TB are both kept at read potential VCCR.

Then, current flows from bit line BL1 through memory cell MC1 to bit line BL2 to read data from storage area L2 of memory cell MC1. Further, current flows from bit line BL3 through memory cell MC2 to bit line BL2 to read data from storage area L1 of memory cell MC2.

In the second potential generating circuit 400, transistors QN401 and QN402 are turned on since read signal READ is activated. Then, sense amplifier 510 is connected to data input/output line IO and sense amplifier 511 is connected to data input/output line/IO.

Sense amplifier 510 accordingly detects the current flowing from bit line BL1 to memory cell MC1 and provides the outcome of the detection to decoding circuit 403. Sense amplifier 511 detects the current flowing from bit line BL3 to memory cell MC2 and provides the outcome of the detection to decoding circuit 403. Decoding circuit 403 decodes the outcome of the detection supplied from sense amplifier 510 to 2-bit data. Further, decoding circuit 403 decodes the outcome of the detection supplied from sense amplifier 511 to 2-bit data.

Further, 4-bit data may simultaneously be read by the operation as described above.

The semiconductor memory device according to this embodiment of the present invention is thus capable of simultaneously writing 4-bit data by changing the source voltage, and is also capable of simultaneously reading 4-bit data. The throughput is accordingly improved. Moreover, the potential on bit line BL is controlled by means of write data so as to allow 4-bit data to simultaneously be written, the write/read circuit may be arranged in the peripheral region outside the memory cell array. The number of elements within the memory cell array can thus be reduced. In addition, as the potential on the bit line is controlled in writing by using the pair of data input/output lines IO and/IO, the number of elements within the memory cell array can be reduced.

Second Embodiment

Instead of the simultaneous writing of 4-bit data by the semiconductor memory device of the first embodiment, simultaneous writing of 3-bit data is also possible by using two storage areas of nonvolatile memory cells.

Figure 19:
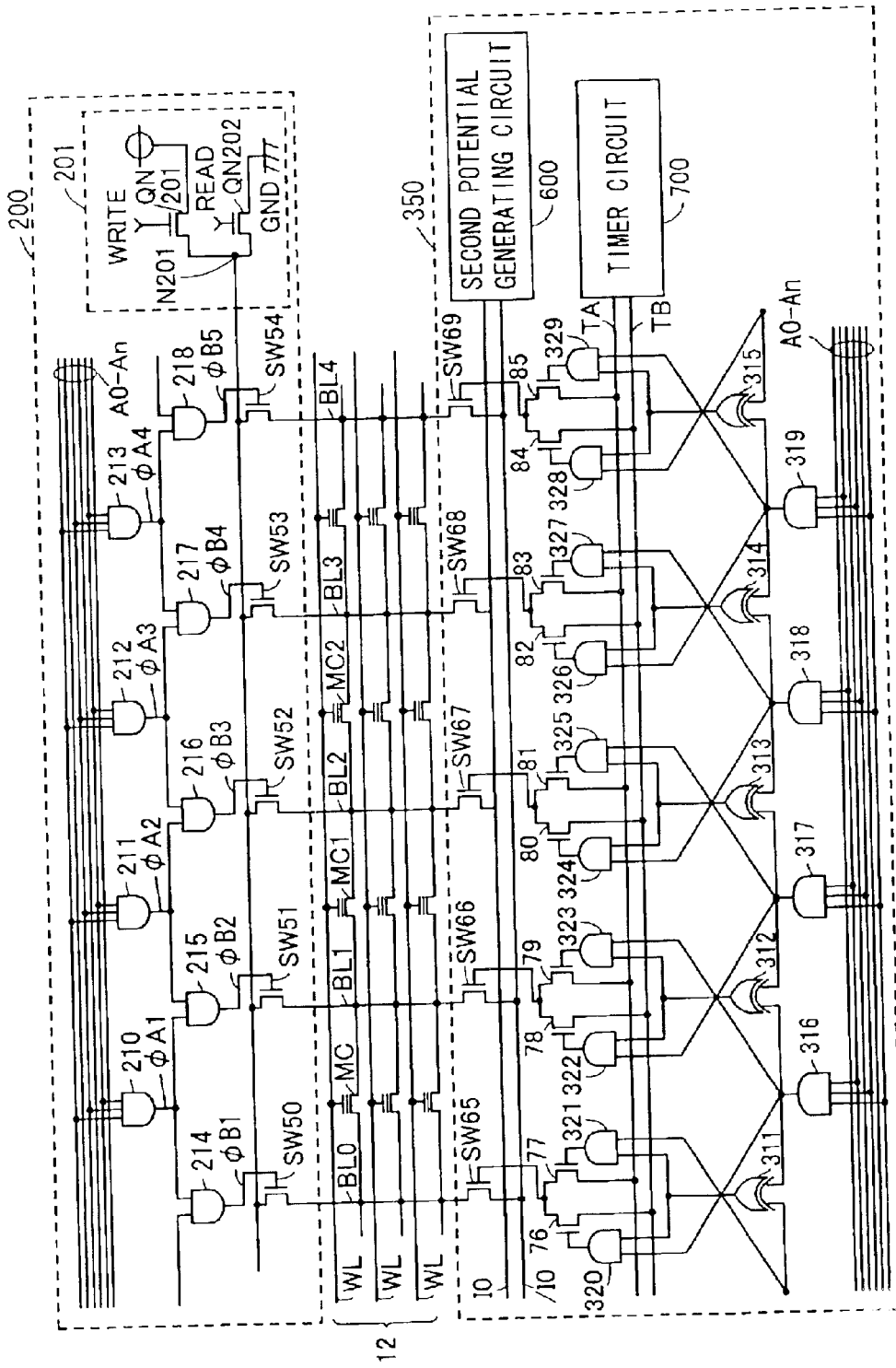
FIG. 19 is a circuit diagram showing a detailed configuration of a write/read circuit and a memory cell array in a semiconductor memory device according to a second embodiment of the present invention.

FIG. 19 is a circuit diagram showing a detailed configuration of a write/read circuit and a memory cell array in a semiconductor memory device according to a second embodiment of the present invention.

Referring to FIG. 19, a second potential generating circuit 600 is provided instead of the second potential generating circuit 400 shown in FIG. 16. In addition, a timer circuit 700 is provided instead of timer circuit 500.

Other circuit elements are the same as those in FIG. 16 and description thereof is not repeated here.

Figure 20:
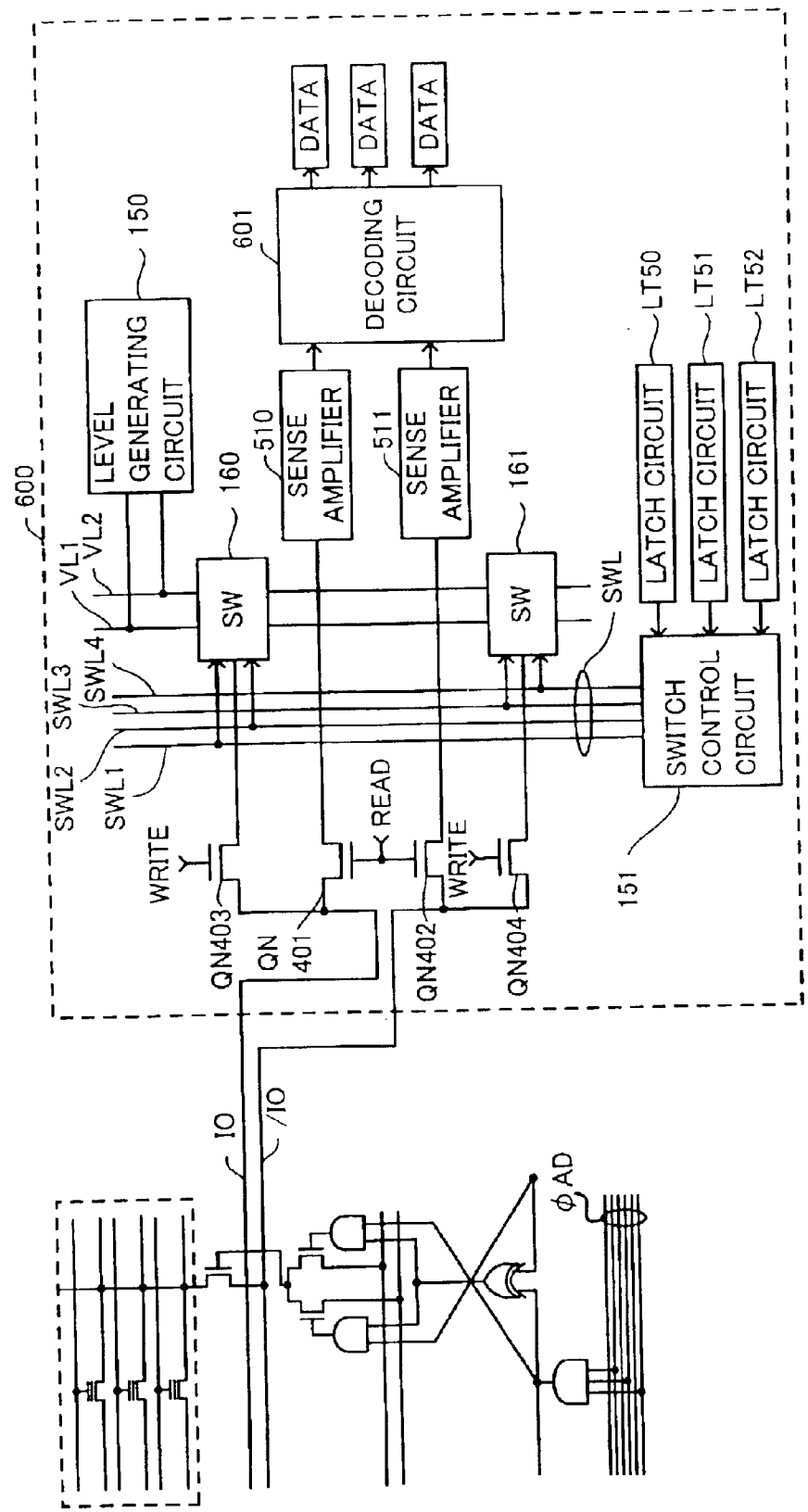
FIG. 20 is a circuit diagram showing a configuration of a second potential generating circuit in FIG. 19.

FIG. 20 is a circuit diagram showing a configuration of the second potential generating circuit 600 in FIG. 19.

Referring to FIG. 20, the second potential generating circuit 600 includes a decoding circuit 601 instead of decoding circuit 403 of the second potential generating circuit 400 in FIG. 17. The second potential generating circuit 600 additionally includes a level generating circuit 150, switch circuits 160 and 161, a switch control circuit 151, and latch circuits LT50–LT52.

Decoding circuit 601 outputs 3-bit data according to the outcome of detection by sense amplifier 510 and the outcome of detection by sense amplifier 511.

Transistor QN403 is connected between data input/output line IO and switch circuit 160 and has its gate receiving write signal WRITE. Transistor QN404 is connected between data input/output line/IO and switch circuit 161 and has its gate receiving write signal WRITE.

Level generating circuit 150 supplies different voltages respectively to signal lines VL1 and VL2. Switch circuits 160 and 161 are both connected to signal lines VL1 and VL2. Switch circuit 160 is connected to switch control lines SWL1 and SWL2. Switch circuit 161 is connected to switch control lines SWL3 and SWL4.

In a writing operation, latch circuits LT50–LT52 latch respective data signals DQ50–DQ52 to be stored in two storage areas of nonvolatile memory cells.

In the writing operation, switch control circuit 151 controls switch circuits 160 and 161 according to any combination of data signals DQ50–DQ52 latched by latch circuits LT50–LT52.

Switch control circuit 151 controls switch circuit 160 according to the combination of data signals DQ50 and DQ51. Specifically, when both of data signals DQ50 and DQ51 have H level, switch circuit 160 selects signal line VL1 to connect transistor QN403 to signal line VL1. When data signal DQ50 has L level while data signal DQ51 has H level, switch circuit 160 selects signal line VL2 to connect transistor QN403 to signal line VL2. When data signal DQ51 has L level, switch circuit 160 selects none of signal lines VL1 and VL2 regardless of the logic level of data signal DQ50. Accordingly, data input/output line IO enters the floating state.

Similarly, switch circuit 161 selects signal line VL1 when data signal Q52 has H level while data signal DQ51 has L level to connect transistor QN404 to signal line VL1. When both of data signals DQ52 and DQ51 have L level, switch circuit 161 selects signal line VL2. When data signal DQ51 has H level, switch circuit 161 selects none of signal lines VL1 and VL2 regardless of the logic level of data signal DQ52. Then, data input/output line/IO enters the floating state.

By the method for the writing operation as described above, the combination of 3-bit data written into two storage areas determines a predetermined voltage supplied to data input/output lines IO and/IO. In other words, according to the combination of data to be written, the source voltage is determined.

Other circuit components are the same as those in FIG. 17 and description thereof is not repeated here.

Figure 21:
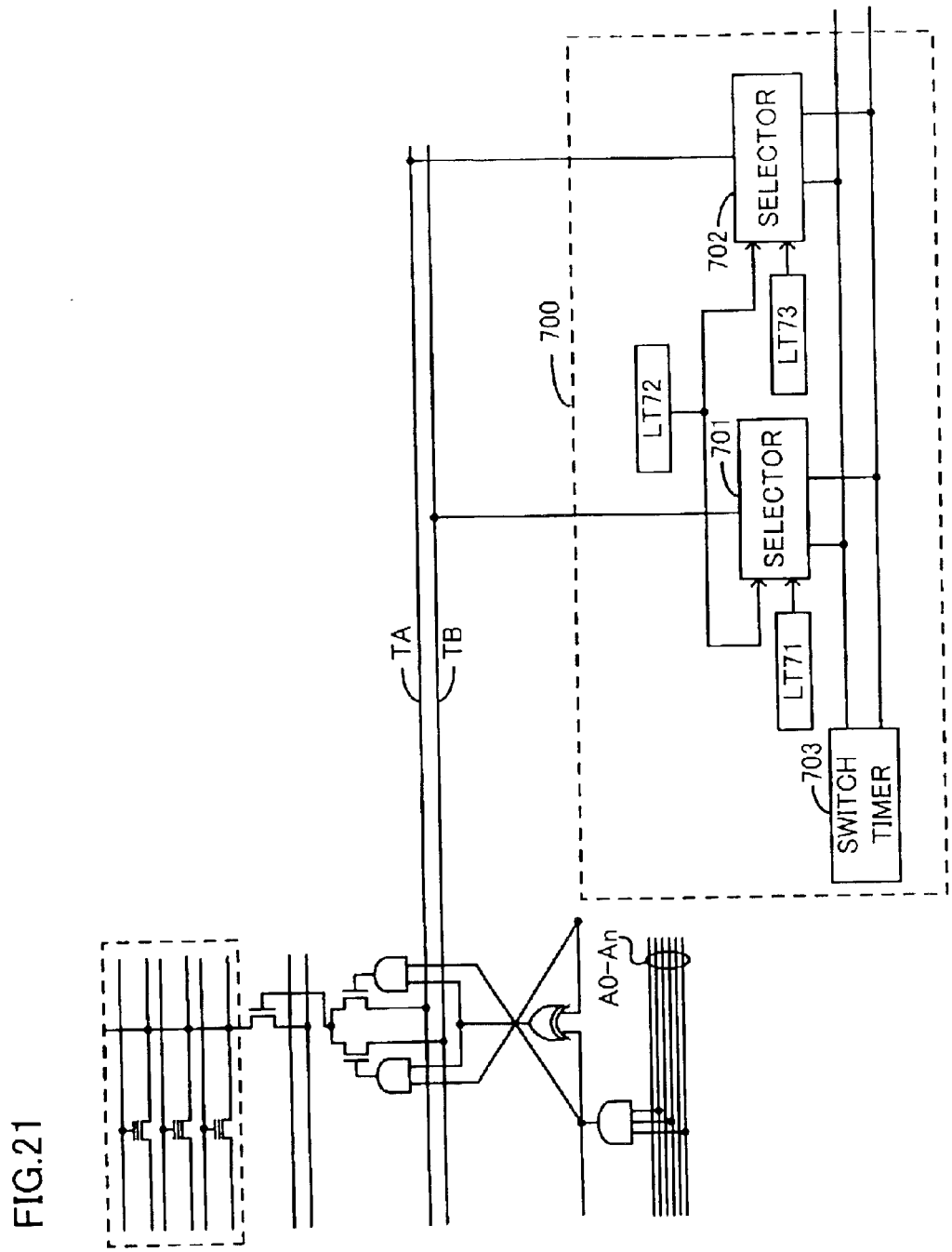
FIG. 21 is a circuit diagram showing a configuration of a timer circuit in FIG. 19.

FIG. 21 is a circuit diagram showing a configuration of timer circuit 700 shown in FIG. 19.

Referring to FIG. 21, timer circuit 700 includes selectors 701 and 702, a switch timer 703 and latch circuits LT71–LT73.

Latch circuits LT71–LT73 latch data to be stored in different storage areas of two memory cells MCs adjacent to each other. Suppose that three data are to be stored in storage area L2 of memory cell MC1 and storage area L1 of memory cell MC2 in FIG. 19. Then, latch circuits LT71–LT73 store three data signals DQ50–DQ52 respectively.

Switch timer 703 outputs a switch signal SS3 as an H level pulse and a switch signal SS4 kept at L level. Selector 701 receives two switch signals SS from switch timer 703 to output switch signal SS according to the combination of data latched by latch circuits LT71 and LT72 to signal line TB. Similarly, selector 702 receives two switch signals SS from switch timer 703 to output switch signal SS to signal line TA according to the combination of data latched in latch circuits LT72 and LT73.

Operations of the write/read circuit configured as described above are the same as those of the first embodiment and description thereof is not repeated.

The semiconductor memory device according to this embodiment of the present invention is capable of simultaneously writing 3-bit data by changing the source voltage, and further capable of simultaneously reading 3-bit data, which means that the throughput is improved. Moreover, write data is used to control the potential on bit line BL in order to simultaneously write 3-bit data, and the write/read circuit may be placed in the peripheral region outside the memory cell array, which means that the number of elements within the memory cell array is reduced. In writing, a pair of data input/output lines IO and/IO is used to control the potential on the bit line. Then, the number of elements in the memory cell array is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of word lines arranged in the direction of rows;
   a plurality of bit lines arranged in the direction of columns;
   a plurality of memory cells arranged in the row direction and in the column direction and each having at least one storage area for storing data therein; and
   a write circuit for writing multiple data into said plurality of memory cells,
   said plurality of memory cells arranged in said row direction being connected in series and having respective gates connected to a word line placed in said row direction,
   said plurality of bit lines being connected correspondingly to said plurality of memory cells,
   said plurality of memory cells each for storing one of at least three values of the data according to the amount of charge held in said storage area, and
   said write circuit including
   a bit line selection circuit for selecting a plurality of bit lines connected to memory cells to be written, and
   a potential supply circuit for supplying a plurality of predetermined potentials according to a combination of said multiple data to said plurality of selected bit lines,
   said potential supply circuit for supplying a predetermined first potential to bit lines included in said plurality of selected bit lines and connected to respective drains of said memory cells to be written, and supplying a predetermined second potential determined according to the combination of said multiple data to bit lines included in said plurality of selected bit lines and connected to respective sources of said memory cells to be written.

2. The semiconductor memory device according to claim 1, wherein
   said bit line selection circuit selects a plurality of bit lines connected to two memory cells to be written, said two memory cells adjacent to each other and included in said plurality of memory cells connected in series, and
   said potential supply circuit supplies said first potential to one or two bit lines included in said plurality of selected bit lines and connected to respective drains of said two adjacent memory cells to be written, and supplies said second potential determined according to the combination of said multiple data to one or two bit lines included in said plurality of selected bit lines and connected to respective sources of said two adjacent memory cells to be written.

3. The semiconductor memory device according to claim 1, wherein
   said potential supply circuit includes
   a first potential generating circuit for supplying said first potential and
   a second potential generating circuit for supplying said second potential, and
   said second potential generating circuit includes
   a multilevel potential generating circuit for generating a plurality of potentials with different levels and
   a selection circuit for selecting, as said second potential, one potential with a level corresponding to the combination of said multiple data from among said plurality of potentials.

4. A semiconductor memory device comprising:
   a semiconductor substrate having a main surface;
   a memory cell array including a plurality of memory cells; and
   a write circuit for applying a write potential to a selected one of said plurality of memory cells,
   said plurality of memory cells each including
   first and second conductive regions formed on said main surface of said semiconductor substrate,
   a channel region formed at said main surface of said semiconductor substrate and between said first conductive region and said second conductive region, channel hot electrons being generated in said channel region in a writing operation,
   a first insulating film formed on said main surface of said semiconductor substrate and on said channel region,
   a charge storage film formed on said first insulating film and having a plurality of storage areas,
   a second insulating film formed on said charge storage film, and
   a conductive layer formed on said second insulating film,
   said write circuit for setting a potential difference between said first conductive region and said second conductive region of said memory cell at a potential difference determined according to a combination of multiple data written into said memory cell in writing operation.

5. A semiconductor memory device comprising:
   a semiconductor substrate of a first conductivity type having a main surface;
   a plurality of first conductive regions of a second conductivity type formed on said main surface of said semiconductor substrate at predetermined intervals therebetween;
   a plurality of second conductive regions of said first conductivity type formed on said main surface of said semiconductor substrate, said second conductive regions formed respectively in respective regions of said plurality of first conductive regions; and a plurality of memory cell arrays formed respectively in respective regions of said plurality of second conductive regions, said plurality of memory cell arrays each including a plurality of memory cells, said plurality of memory cells each including third and fourth conductive regions formed on said main surface of said semiconductor substrate, a channel region formed at said main surface of said semiconductor substrate and between said third conductive region and said fourth conductive region, channel hot electrons being generated in said channel region in a writing operation, a first insulating film formed on said main surface of said semiconductor substrate and on said channel region, a charge storage film formed on said first insulating film and having a plurality of storage areas, a second insulating film formed on said charge storage film, and a conductive layer formed on said second insulating film, a predetermined potential being supplied to said plurality of first conductive regions and said plurality of second conductive regions.

* * * * *